United States Patent
Tran et al.

(10) Patent No.: US 6,788,608 B2
(45) Date of Patent: Sep. 7, 2004

(54) HIGH VOLTAGE PULSE METHOD AND APPARATUS FOR DIGITAL MULTILEVEL NON-VOLATILE MEMORY INTEGRATED SYSTEM

(75) Inventors: Hieu Van Tran, San Jose, CA (US); William John Saiki, Mountain View, CA (US); Jack Edward Frayer, Boulder Creek, CA (US); Michael Stephen Briner, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 8 days.

(21) Appl. No.: 10/209,538

(22) Filed: Jul. 30, 2002

(65) Prior Publication Data

US 2004/0022112 A1 Feb. 5, 2004

(51) Int. Cl.[7] .................................................. G11C 7/00
(52) U.S. Cl. .................... 365/226; 365/227; 365/189.09
(58) Field of Search .................................. 365/226, 228, 365/227, 189.05, 207

(56) References Cited

U.S. PATENT DOCUMENTS 6,160,391 A * 12/2000 Banba ........................ 323/313
6,504,736 B1 * 1/2003 Ono ............................ 363/73

* cited by examiner

Primary Examiner—Thong Q. Le
(74) Attorney, Agent, or Firm—Gray Cary Ware & Freidenrich LLP

(57) ABSTRACT

A digital multilevel non-volatile memory integrated system includes an apparatus and method for high voltage, high precision pulsing generation. A voltage generator includes a low voltage high speed generator, a low voltage to high voltage high speed level translator, and a high voltage driver. A precise and stable high voltage level is attained across power supply, process, or temperature variation. The power may be optimized at the high voltage supply as tradeoff with power in the low voltage supply. A ping-pong operation sets up a high voltage level and the high voltage pulsing is output in a ping-pong fashion. A slew rate control circuit slows the input to achieve faster settling times. The high voltage is shaped by low voltage switching, HV fast switching and ramp circuit control. The high voltage pulsing may be fast and precise to permit real time control of the pulse parameters to adapt to memory cell attributes.

38 Claims, 13 Drawing Sheets

HIGH VOLTAGE PULSE METHOD AND APPARATUS FOR DIGITAL MULTILEVEL NON-VOLATILE MEMORY INTEGRATED SYSTEM

BACKGROUND OF THE INVENTION

As information technology progresses at an unprecedented pace, the need for information storage increases proportionately. Accordingly, the non-volatile information in stationary or portable communication demands higher capability and capacity storage. One approach to increasing the amount of storage is by decreasing physical dimensions of the stored bit (e.g., memory cell) to smaller dimensions, such as the nano technology. Another approach is to increase the stored density per bit. This second approach is known as digital multilevel non-volatile storage technology.

SUMMARY OF THE INVENTION

A digital multilevel non-volatile memory integrated system includes an apparatus and method for high voltage, high precision pulsing generation. The system may include a pulse signal generator that comprises a bias current generator for generating a plurality of bias currents. A voltage level generator generates a first high voltage signal in response to at least one of the bias currents. An operational amplifier has a first input coupled to the high voltage level generator, has an output for generating a pulsed shaped high voltage signal, and has a second input for receiving pulsed shaped high voltage signal. The high voltage pulsing may be fast and precise to permit real time control of the pulse parameters to adapt to memory cell attributes.

DETAILED DESCRIPTION

As used herein, a N-type NMOS enhancement transistor is an enhancement transistor having a gate threshold, for example in the range of approximately 0.3 to 1.0 volts. A P-type transistor is a PMOS enhancement transistor having a gate threshold approximately in the range of −0.3 to −1.0 volts. A NZ NMOS transistor is a native low voltage transistor having a gate threshold approximately in the range of −0.1 to 0.3 volts. An NH NMOS transistor is an enhancement high voltage transistor having a gate threshold approximately in the range of 0.3 to 1.0 volts. A PH PMOS transistor is an enhancement high voltage transistor having a gate threshold of approximately in the range −0.3 to −1.0 volts. An NX NMOS transistor is a native high voltage transistor having a gate threshold voltage approximately in the range −0.1 to 0.3 volts.

Figure 1:
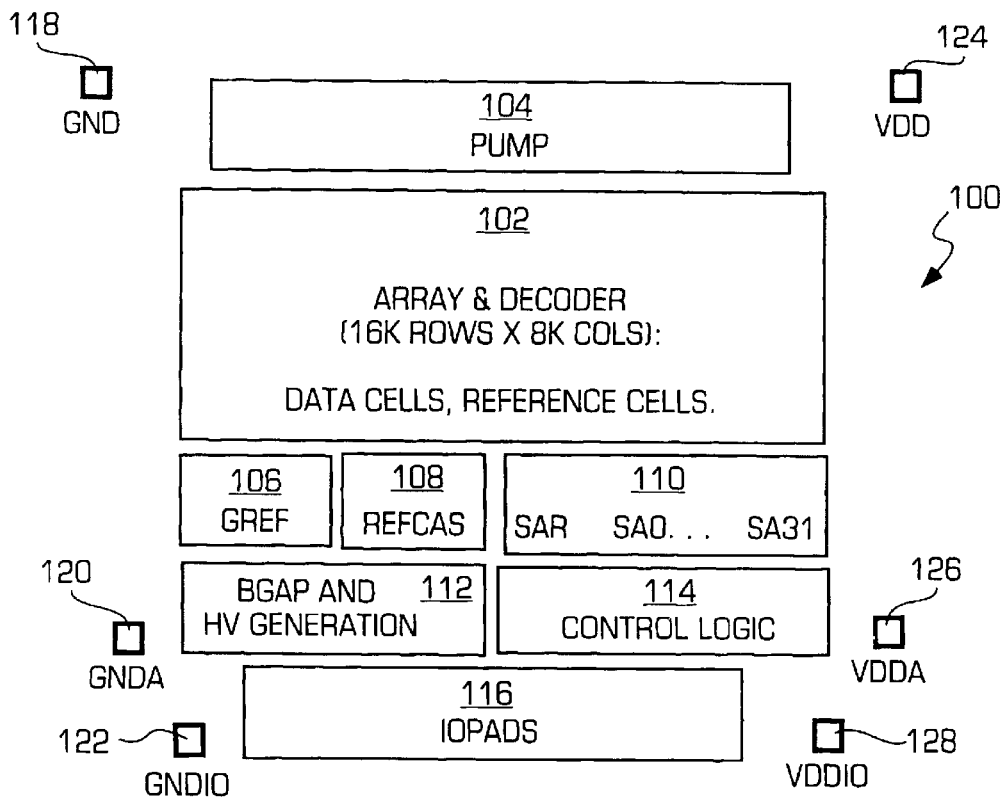
FIG. 1 is a block diagram illustrating a non-volatile multilevel memory system according to the present invention.

FIG. 1 is a block diagram illustrating a non-volatile multilevel memory system 100 according to the present invention. The non-volatile multilevel memory system 100 comprises an array 102, a charge pump 104, a global reference level (GREF) generator 106, a reference cascoding generator (REFCAS) 108, a sense amplifier 110, a voltage generator (BGAP & HV generation) 112, a control logic circuit 114, input/output (I/O) pads 116, a first ground (GND) pad 118, a second ground (GNDA) pad 120, a third ground (GNDIO) pad 122, a first voltage (VDD) pad 124, a second voltage (VDDA) pad 126, and a third voltage (VDDIO) pad 128.

The array 102 comprises a plurality of memory cells (not shown) and a plurality of decoders (not shown). The memory cells may include data cells and reference cells. In one embodiment, the memory cells are arranged in 16K rows by 8K columns. In one embodiment, the memory array includes a source side injection flash technology, which uses lower power in hot electron programming and efficient injector based Fowler-Nordheim tunneling erasure. The programming is done by applying a high voltage on the source of the memory cell, a bias voltage on the control gate of the memory cell, and a bias current on the drain of the memory cell. The erase is done by applying a high voltage on the control gate of the memory cell and a low voltage on the source and/or drain of the memory cell. The verify (sensing or reading) is done by placing the memory cell in a voltage mode sensing, e.g., a bias voltage on the source, a bias voltage on the gate, a bias current on the drain, and the voltage on the drain is the readout voltage. In another embodiment, the verify (sensing or reading) is done by placing the memory cell in a current mode sensing, e.g., a low voltage on the source, a bias voltage on the gate, a load (resistive or transistors) coupled to the drain, and the voltage on the load is the readout voltage. In one embodiment, the array architecture is the one disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

In a normal operation mode, the charge pump 104 is enabled to convert a voltage from a power supply (VSUP) 220 (see FIG. 2) to a high voltage suitable for non-volatile memory operation, such as program and erase operation. In one embodiment, the charge pump 104 may be the charge pump disclosed in pending U.S. patent application Ser. No. 10/044,273, entitled "High voltage generation and regulation system for digital multilevel nonvolatile memory", filed Jan. 10, 2002, the subject matter of which is incorporated herein by reference. The output of the charge pump 104 is regulated to a precise voltage that functions as a high voltage supply source for a high voltage pulsing circuit that is part of the voltage generator (BGAP & HV generation) 112. The output of the high voltage pulsing circuit is wave-shaped and applied to the decoders (not shown) and subsequently to the memory cells (not shown) in the array 102.

The global reference level (GREF) generator 106 generates global reference voltages used for global reading and writing of the data cells and reference cells in the memory array 102.

The reference cascoding generator 108 generates local reference levels from local reference memory cells used for local reading and writing of the data cells in the memory array 102.

The voltage generator 112 includes a high voltage, high speed level generator, a low voltage to high voltage high speed level translator, and a precision high voltage driver. In one embodiment, the high voltage level is precise and stable and is attained across power supply, process corner, or temperature variations. In one embodiment, the voltage generator allows power to be optimized at high voltage, but the expense of power at the low voltage supply. This may be done, for example, by using the low voltage circuits to accomplish the complex pulse shaping.

The voltage generator 112 may also use high speed pulse generation by utilizing a low voltage section for speed. A ping pong operation may be used in which the high voltage level is set up and the pulsing is set at a ping pong fashion. A wrap control circuit may control the input voltage step, and hence achieve a fast settling time.

The voltage generator 112 may include high voltage shaping through a combination of low voltage switching, high voltage fast switching and the wrap control circuit. In one embodiment, the voltage generator includes digital control to provide real time control of voltage levels. This allows the high voltage pulsing to be adaptive to individual memory cell characteristics. For example, the high voltage could adapt to the uneven rows of memory cells or top and bottom sections effects of the memory array 102. Also, for example, the high voltage could adapt to memory cell behavior over temperature or process corner. Also, for example, the high voltage may adapt to the physics of the memory cells at different memory readout voltage levels.

Sensitive sections of the voltage generator 112, for example, the high voltage pulsing circuit, may be positioned away from circuits that generate noise, such as the charge pump 104 and the input/output buffers 116. The pads 120 and 126 may be separated from the power pads 118 and 124 and the pads 122 and 128.

The sense amplifier 110 interfaces with the array 102 for reading and writing the memory cells. The control logic circuit 114 provides control signals for the elements of the system 100. The input/output (I/O) pads 116 provide physical connections for signal lines data address lines for interfacing with the system 100.

Figure 2:
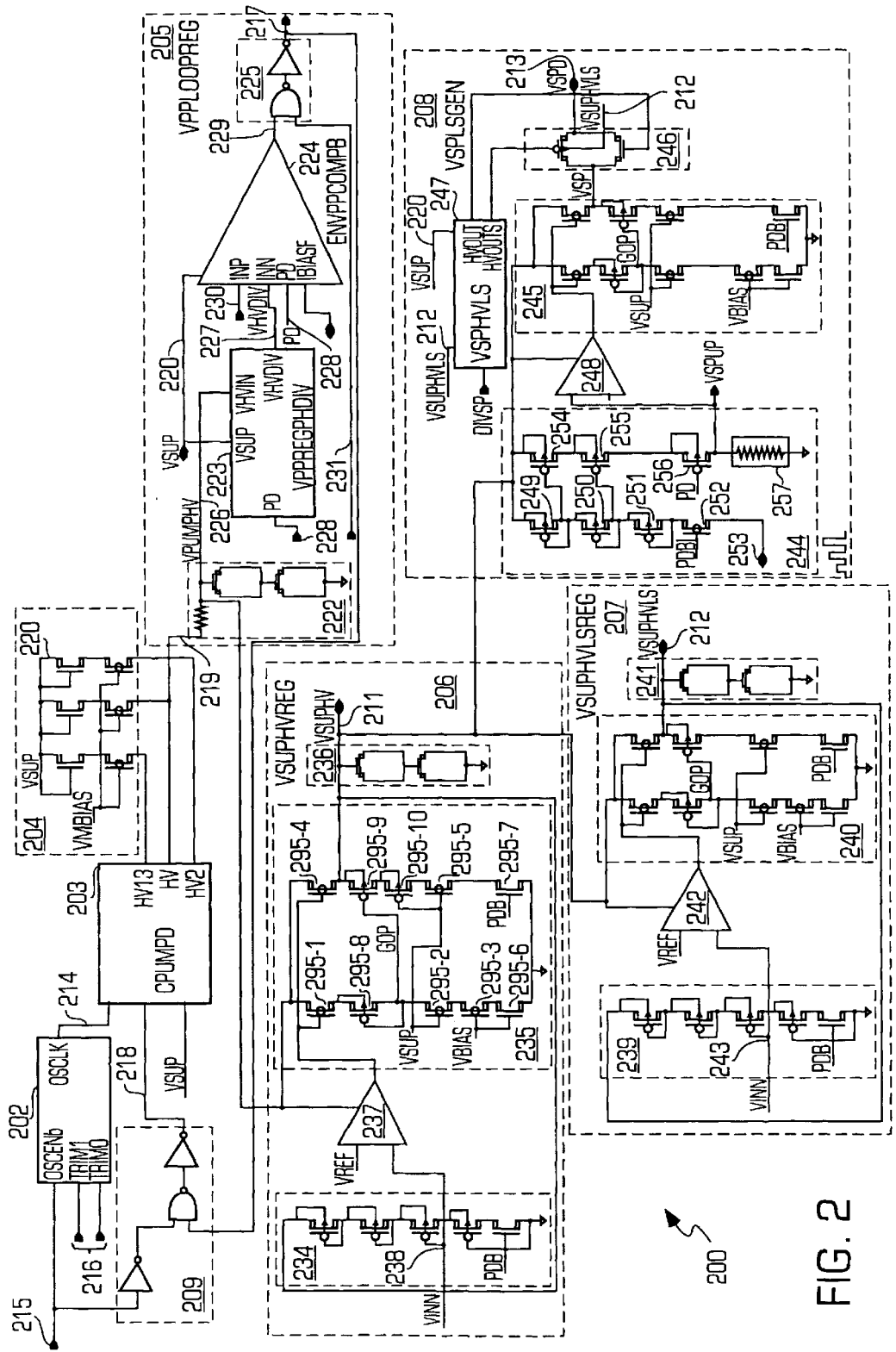
FIG. 2 is a block diagram illustrating a high voltage generator of the non-volatile multilevel memory system of FIG. 1.

FIG. 2 is a block diagram illustrating a high voltage generator 200 of the voltage generator 112 of the non-volatile multilevel memory system 100. The high voltage generator 200 comprises an oscillator 202, a charge pump 203, a bias circuit 204, a VPP loop regulator 205, a high voltage supply regulator 206, a low high voltage supply regulator 207, a shaped high voltage supply regulator 208, and an enable circuit 209.

The high voltage generator 200 generates a plurality of voltages signals having different voltage levels. The high voltage supply regulator 206 generates a high voltage supply (VSUPHV) signal 211. In one embodiment, the high voltage supply (VSUPHV) signal 211 has a voltage level of 11.5 volts +/−0.15 volts. The low high voltage supply regulator 207 generates a low high voltage supply (VSUPHVLS) signal 212. In one embodiment, the low high voltage supply (VSUPHVLS) signal 212 has a voltage level of 10 volts +/−0.15 volts. The shaped high voltage supply regulator 208 generates a pulsed high voltage (VSPD) signal 213. In one embodiment, the pulsed high voltage (VSPD) signal 213 has a voltage level in the range of 4.5 volts to 9 volts. In one embodiment, the high voltage supply regulator 206, the low high voltage supply regulator 207, and the shaped high voltage supply regulator 208 each include a source follower output for a low impedance driver.

The oscillator 202 generates an oscillator clock (OSCLK) signal 214 for running the charge pump 203. A charge pump enable (CPOSCENB) 215 enables the oscillator 202 and the enable circuit 209. A trim signal (TRIM1, TRIM0) 216 adjusts the frequency of the oscillator clock signal 214.

The VPP loop regulator 205 generates an enable pump oscillator (ENPUMPOS) signal 217 to enable the charge pump 203 via the enable circuit 209. The VPP loop regulator 205 provides nested loop regulation.

The enable circuit 209 generates an enable signal 218 to enable the charge pump 203 as a logic AND of an inversion of the charge pump enable (CPOSCENB) signal 215 and the enable pump oscillator (ENPUMPOS) signal 217.

The charge pump 203 generates a high voltage signal 219 having a voltage level greater than a supply voltage (VSUP) 220. The bias circuit 204 controls biasing in the charge pump 203 and provides bias control of the high voltage signal 219.

The VPP loop regulator 205 comprises a filter 222, a voltage divider 223, a comparator 224, and an AND gate 225. The filter 222 filters the ripple of the high voltage signal 219 from the charge pump 203 to generate a pump high voltage (VPUMPHV) signal 226 which is applied to the voltage divider 223 and the high voltage supply regulator 206. In one embodiment, the filter 222 is a resistor-capacitor filter. The voltage divider 223 generates a high voltage (VHDIV) signal 227 from the pump high voltage (VPUMPHV) signal 226. A power down (PD) signal 228 controls the power down of the voltage divider 223 and the comparator 224.

The comparator 224 generates a compare signal 229 in the event that the divided high voltage signal 227 is above a VPP reference voltage (VPPREF) 230 when enabled by an enable VPP comparison (ENVPPCOMP) signal 231. The AND gate 225 generates the enable pump oscillator (ENPUMPOS) signal 217 in response to the compare signal 229.

The high voltage supply regulator 206 comprises a bias circuit 234, a buffer circuit 235, a capacitor 236, and an operational amplifier 237. The operational amplifier is operated from the high voltage signal (VPUMPHV) 226. A reference voltage is applied to a first input of the operational amplifier. The bias circuit 234 controls an input voltage 238 applied to a second input with the operational amplifier 237. The bias circuit 234 comprises a plurality of PMOS transistors including drain-terminals connected in series between the high voltage supply 211, which is the output of the high voltage supply regulator 206, and ground. Some of the PMOS transistors are diode connected between the high voltage supply signal 211 and the input voltage 238 to limit the high voltage supply signal 211. Other PMOS transistors in the tree limit the input voltage 238 and control power down of the bias circuit 234. The output of the operational amplifier 237 is provided to the buffer circuit 235 which uses a source follower as an output stage for a low impedance driver.

The buffer circuit 235 includes a plurality of NX NMOS transistors 295-1 through 295-5, a plurality of NH NMOS transistors 295-6 and 295-7, and a plurality of PH PMOS transistors 295-8 through 295-10. The NMOS transistors 295-3 and 295-6 provides bias to the transistors 295-1 and 295-8. The NMOS transistors 295-2 and 295-5 provide high voltage buffering. The NH NMOS transistor 295-7 operates as a power down device. The PH PMOS transistor 295-10 provides high voltage buffering for the PMOS transistor 235-9. The NX NMOS transistor 295-4 operates as an up source follower, and the PH PMOS transistor 295-9 operates as a down source follower. The NX NMOS transistor 295-1 and the PH PMOS transistor 295-8 operate as replica bias for the down source follower of the PH PMOS transistor 295-9.

The capacitor 236 filters the high voltage supply signal 211 and is coupled between the source of the NX NMOS transistor 295-4 and ground. In one embodiment, the capacitor 236 includes two series connected NH NMOS transistors.

The low high voltage supply regulator 207 comprises a bias circuit 239, a buffer circuit 240, a capacitor 241, and an operational amplifier 242, which are arranged in a similar manner to the bias circuit 234, the buffer circuit 235 (without a counterpart to the PH PMOS transistor 295-10), the capacitor 236, and the operational amplifier 237. An input voltage (VINN) 243 is applied to the bias circuit 239.

The shaped high voltage supply regulator 208 comprises a bias circuit 244, a buffer circuit 245, a transfer gate 246, a high voltage level shifter 247, and an operational amplifier 248. The bias circuit 244 comprises a plurality of PMOS transistors 249, 250 and 251 and a NX NMOS transistor 252, including drain-source terminals coupled between the high voltage supply signal 211 and a step current 253. In one embodiment, the step current 253 has amplitudes that increase in level for each successive pulse for a predetermined number of pulses. The PMOS transistors 249, 250 and 251 are diode connected. The NX NMOS transistor 252 is disabled by a inversion of the power down signal 228. The bias circuit 244 further comprises PMOS transistors 254, 255, 256 and a resistor 257. The drain-source terminals of the PMOS transistors 254, 255 and 256 are coupled in series between the high voltage supply signal 211 and a first terminal of the resistor 257 and input of the operational amplifier 248. The other terminal where the resistor 257 is at a bias voltage, e.g., grounded. The gates of the PMOS transistor 254 and 255 are biased by the drains of the PMOS transistors 249 and 250, respectively, which operate as a current mirror. The PMOS transistor 256 is biased by the power down signal 228. The regulated output of the buffer circuit 245 is provided through the transfer gate 246 as the pulsed high voltage signal 213. The transfer gate 246 is controlled by the high voltage level shifter 247. The operation of the shaped high voltage supply regulator 208 is better understood in conjunction with the description below of FIGS. 4–15.

Figure 3A:
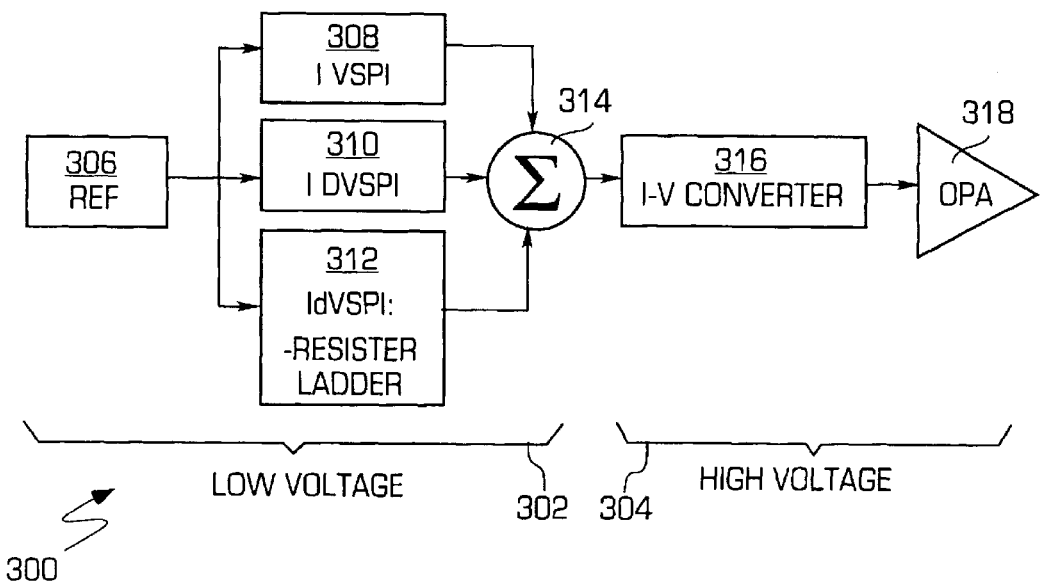
FIG. 3A is a block diagram illustrating a high voltage pulsing circuit of the high voltage generator of FIG. 2.

FIG. 3A is a block diagram illustrating a high voltage pulsing circuit 300.

The high voltage pulsing circuit 300 comprises a low voltage section 302 and a high voltage section 304. The low voltage section 302 comprises a reference circuit 306, An initial current (I_VSPI) generator 308, an incremental current (I_DVSPI) generator 310, an incremental current resistor ladder 312, and a summer 314. The high voltage section 304 comprises a current to voltage converter 316 and an operational amplifier (OPA) 318.

The high voltage pulsing circuit 300 includes a portion of the high voltage pulsing circuit 400 of FIG. 4, described below.

The high voltage pulsing circuit 300 operates based on current for the magnitude and ratio and then converts the current to the final voltage level. The reference circuit 306, which may be a band gap voltage generator provides the bias to the initial current generator 308, the incremental current generator 310, and the incremental current resistor ladder 312. The summer 314 sums the initial current, which is a nominal current, from the initial current generator 308, the programmable initial incremental current from the programmable incremental generators 310 and the programmable continuous incremental current from the incremental current-resistor ladder 312. The low voltage section 302 comprises the majority of the high voltage pulsing circuit 300, and thus the majority of the power consumption of the high voltage pulsing circuit 300 is at low voltage. The current voltage converter 316 converts the summed current from the summer 314 into a voltage which is applied to the operational amplifier 318 for controlling the amplifier 318.

A conventional high voltage generator approach that operates mostly at high voltage has two adverse effects. The first is that the power at high voltage is generated from a charge pump with typical poor efficiency. Thus, the power consumption at high voltage when translated at low voltage is much worse due to low efficiency charge pumping. The second is that due to limited power from the charge pump, it is difficult to operate the circuit at high speed. The high voltage pulsing circuit 300 as noted above operates primarily at low voltage and thereby overcomes the noted adverse effects.

Figure 3B:
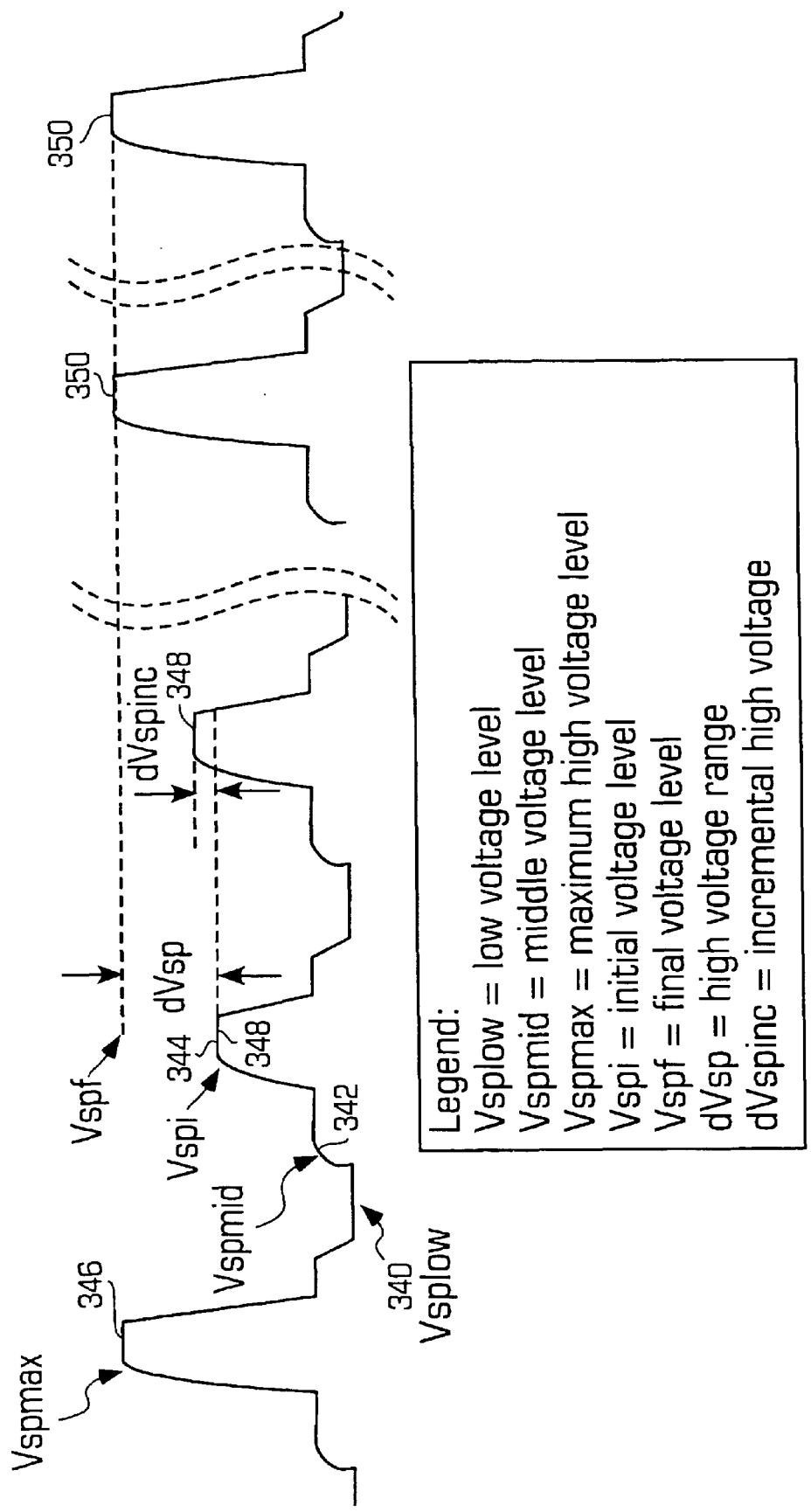
FIG. 3B is a timing diagram illustrating a high voltage pulsing train of the high voltage pulsing circuit of FIG. 3A.

FIG. 3B is a timing diagram illustrating a high voltage pulsing train of the high voltage pulsing circuit 300.

Each pulse includes a low voltage level (VSPLOW) 340, a middle voltage level (VSPMID) 342, and a high voltage level 344. The ramp between the voltage levels is controllable by ramp control circuits. The pulse train is applied to the source of source side injection memory cells as in programming. A bias voltage on the control gate of the memory cell is stable during the low voltage level 340 or during the middle voltage level 342. The bias voltage on the control gate is disabled (e.g., discharged to ground) during the trailing middle voltage level 342 (middle level on falling edge of high voltage) or the next low voltage level 340. A bias current is applied during the low voltage level 340 and is stable during the middle voltage level 342. The bias current is disabled (e.g., discharged to ground) during the trailing middle voltage level 342 or the next low voltage level 340. The actual cell programming mainly occurs during the high voltage level 344 for precise memory cell charge controllability. The low voltage level 340 period is used, for example, for cell read out voltage verification.

In one embodiment, pulse train comprises at least one maximum high voltage pulse 346 having a high voltage level (VSPMAX), followed by at least one incremental high voltage pulses 348, and then followed by at least one fixed high voltage pulses 350. The incremental high voltage pulses 344 have an initial voltage level (Vspi) with subsequent continuous incremental high voltage pulses 348 having an amplitude that is increased by an incremental high voltage (dVspinc). The range of the incremental high voltage pulses 348 have amplitudes that vary in range by a high voltage range (dVsp) with a maximum final voltage level (Vspf). The incremental high voltage (dVspinc) of the incremental high voltage pulses 348 from one pulse to the next is controllable. The fixed high voltage pulses 350 have an amplitude of (Vspf).

Figure 4:
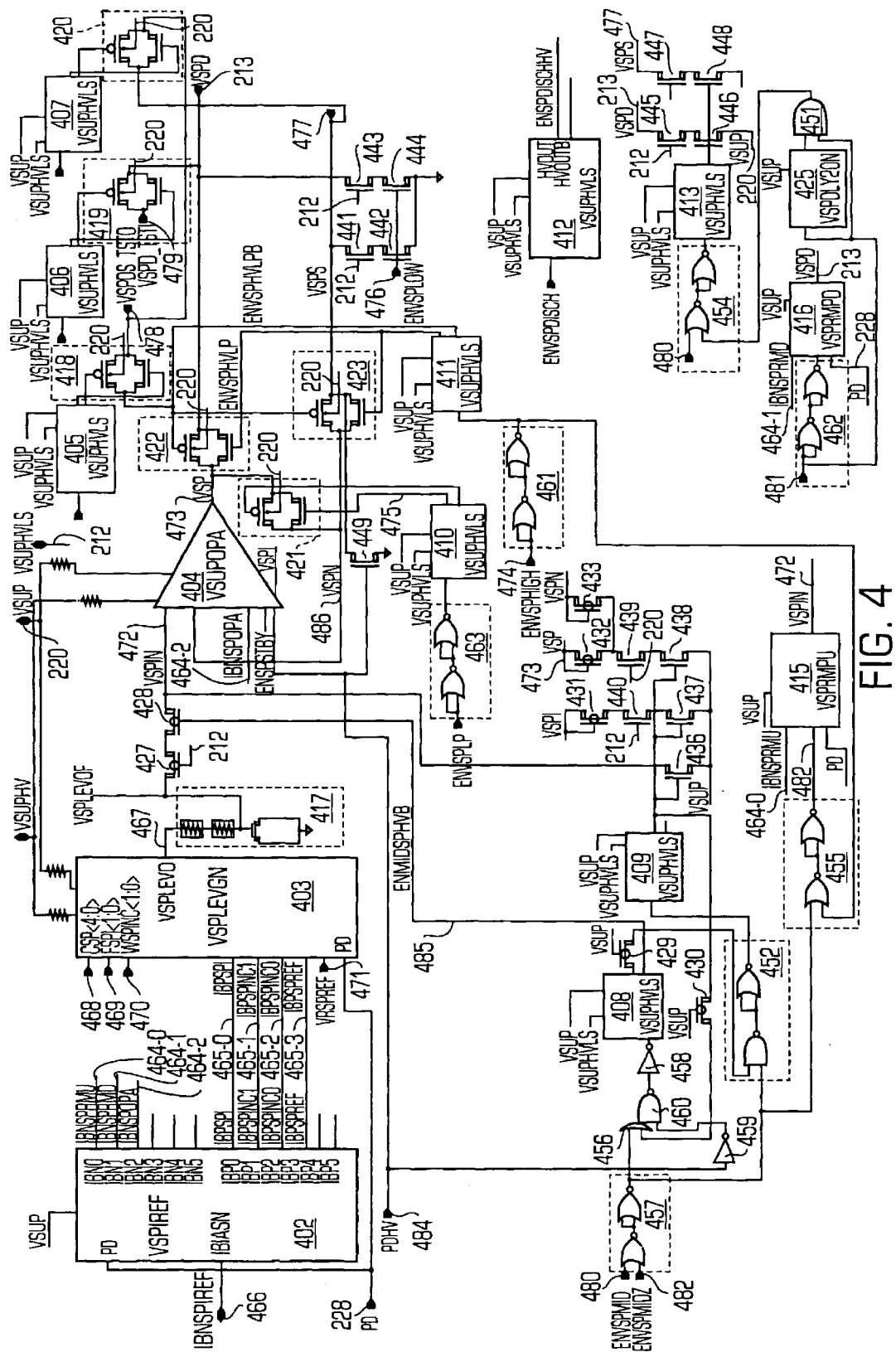
FIG. 4 is a block diagram of a high voltage pulsing circuit of the non-volatile multilevel memory system of FIG. 1.

FIG. 4 is a block diagram of a high voltage pulsing circuit 400. The high voltage pulsing circuit 400 comprises a current bias generator (vspiref) 402, a high voltage level generator (vsplevgn) 403, an operational amplifier 404, a plurality of high voltage level shifters (vsphvls) 405, 406, 407, 408, 409, 410, 411, 412, 413, a ramp up control (vsprmpu) circuit 415, a ramp down control (vsprmpd) circuit 416, a filter 417, transfer gates 418, 419, 420, 421, 422, 423, a delay circuit 425, a plurality of NX NMOS transistors 427 through 433, a plurality of NH NMOS transistors 436 through 449, a plurality of AND gates 451 and 452, a plurality of OR gates 454 through 457, a plurality of inverters 458 and 459, a NAND gate 460, and a plurality of buffers 461, 462 and 463.

The bias generator 402 generates a first bias (IBNSPRMU) current 464-0, a first bias (IBNSPRMD) current 464-1, and a first bias (IBNSPOPA) current 464-2 for application to the ramp up control (vsprmpu) circuit 415, the ramp down control (vsprmpd) circuit 416, and the high voltage operational amplifier (vspopa) 404, respectively, in response to a reference bias (IBNSPREF) current 466 applied thereto. The reference (IBNSPREF) current 466 may be provided by a band gap reference circuit (not shown). The bias generator 402 also generates second bias currents (IBPSPI) 465-0, (IBPSPINC1) 465-1, (IBPSPINC0) 465-2, and (IBPSPREF) 465-3 for application to the high voltage level generator (vsplevgn) 403 in response to the reference bias (IBNSPREF) current 466. The power down (PD) signal 228 controls the power down of the bias generator 402 and the high voltage level generator 403.

Figure 5:
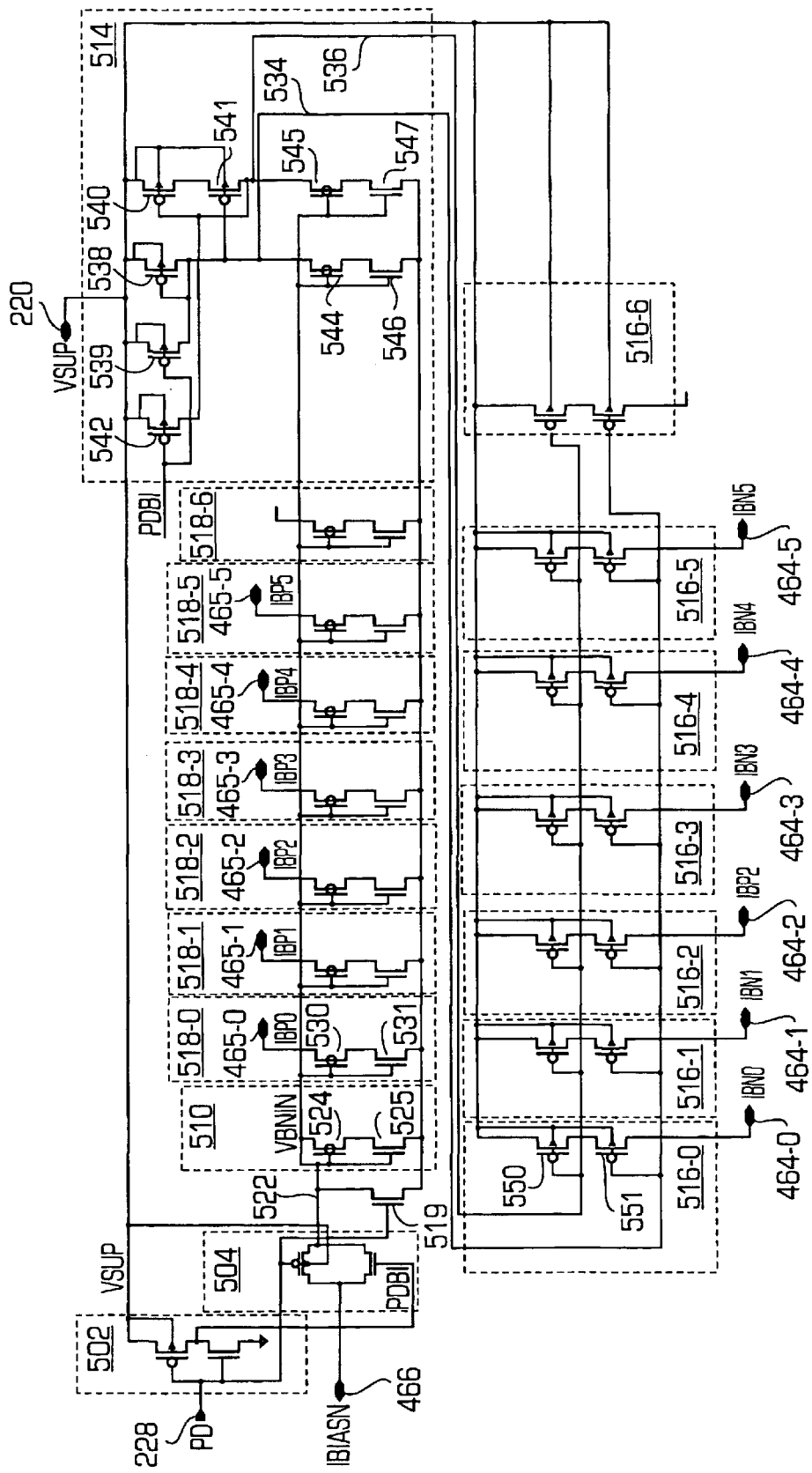
FIG. 5 is a block diagram illustrating a current bias generator of the high voltage pulsing circuit of FIG. 4.

FIG. 5 is a block diagram illustrating the current bias generator 402.

The current bias generator 402 comprises an inverter 502, a transfer gate 504, a bias circuit 510, a bias control circuit 514, a plurality of first bias current stages 516-0 through 516-6, a plurality of second bias current stages 518-0 through 518-6, and an N NMOS transistor 519.

The reference bias (IBNSPREF) current 466 is applied via the transfer gate 504 to an input bias voltage (VBNIN) line 522, which biases the bias circuit 510, the bias control circuit 514, and the plurality of second bias current stages 518. The transfer gate 504 is controlled by the power down (PD) signal 228 and an inverted power down signal from the inverter 502. A low level of the power down signal 228 turns on the transfer gate 504. The NMOS transistor 519 includes drain-source terminals coupling the input bias voltage (VBNIN) line 522 to ground in response to a high level of the power down signal 228 applied to a gate thereof to power down the current bias generator 402.

The bias circuit 510 controls the bias of the input bias voltage (VBNIN) line 522. The bias circuit 510 comprises an NZ NMOS transistor 524 and an N NMOS transistor 525 that include drain-source terminals coupled in a self cascode arrangement between the input bias voltage (VBNIN) line 522 and ground, and include gates coupled to each other and to the input bias voltage (VBNIN) line 522.

The second bias current stages 518-0 through 518-5 generate the second bias currents 465-0 through 465-5, respectively. Each second bias current stage 518 comprises an NZ NMOS transistor 530 and an N NMOS transistor 531 coupled in a cascode arrangement between the second bias current 465 and ground, and including gates biased by the input bias voltage (VBNIN) line 522. (For clarity, only the transistors 530 and 531 of the second bias current stage 518-0 are labeled with reference numbers.) The second bias current stage 518-6 provides a test interface.

The bias control circuit 514 provides bias current on first and second bias lines 534 and 536, respectively, to the first bias current stages 516-0 through 516-5. The bias control circuit 514 comprises PMOS transistors 538, 539, 540, 541, and 542, NZ NMOS transistors 544, 545 and N NMOS transistor 546, 547. The PMOS transistors 538, the NZ NMOS transistor 544, and the N NMOS transistors 546 provide a bias voltage to the first bias line 534, which is coupled to the first bias current stages 516. The PMOS transistor 538 includes a source terminal coupled to the supply voltage 220 and is diode connected with its gate coupled to its drain and to the first bias line 534. The NZ NMOS transistor 544 includes a drain terminal coupled to the drain terminal of the PMOS transistor 538, and includes a gate coupled to the input bias voltage (VBNIN) line 522. The NMOS transistor 546 includes drain-source terminals coupled between the source of the NZ NMOS transistor 544 and ground, and includes a gate coupled to the input bias voltage (VBNIN) line 522. The PMOS transistor 539 provides additional current to the first bias line 534 during power down. The PMOS transistor 539 includes drain-source terminals coupled between the supply voltage 220 and the common node formed of the gate and drain of the PMOS transistor 538, and includes a gate controlled by the inverted power down signal from the inverter 502.

The PMOS transistors 540, 541, the NZ NMOS transistor 545 and the NMOS transistor 547 provide a bias current to a second bias line 536, which is coupled to the first bias current stages 516. The PMOS transistor 540 includes a source terminal coupled to the supply voltage 220. The PMOS transistor 541 includes a source coupled to the drain of the PMOS transistor 540, includes a drain coupled to the second bias line 536, and includes a gate coupled to the common node of the drain of the PMOS transistor and the first bias line 534. The NZ NMOS transistor 545 includes a drain terminal coupled to the common node formed of the second bias line 564 and the drain terminal of the PMOS transistor 541, and includes a gate coupled to the input bias voltage (VBNIN) line 522. The NMOS transistor 547 includes drain-source terminals coupled between the source of the NZ NMOS transistor 545 and ground, and includes a gate coupled to the input bias voltage (VBNIN) line 522. The PMOS transistor 542 provides additional current to the second bias line 536 during power down. The PMOS transistor 542 includes drain-source terminals coupled between the supply voltage 220 and the common node formed of the second bias line 536 and the gate of the PMOS transistor 540, and includes a gate controlled by the inverted power down signal from the inverter 502.

The first bias current stages 516-0 through 516-5 generate the second bias current 464. Each bias current stage 516 comprises PMOS transistors 550, 551. (For clarity, only the transistors of the first bias current stage 516-0 are labeled with reference numbers.) The PMOS transistors 550, 551 include drain-source terminals coupled in series between the supply voltage 220 and the first bias current line 464. The gate of the PMOS transistor 550 is biased by the second bias line 536. The gate of the PMOS transistor 551 is biased by the first bias line 534. In another embodiment, each bias current stage 516 may further comprise additional PMOS transistors coupled in a similar configuration and in parallel with the PMOS transistors 550 and 551 for providing additional bias current. The first bias current stage 516-6 provides a test interface.

Refer again to FIG. 4. The high voltage level generator 403 generates a high voltage (VSPLEV0) signal 467 in response to the second bias currents 465, a reference voltage select (CSP) signal 468, a trim initial current select (FSPI) signal 469, an incremental current select (MSPINC) signal 470, and a reference voltage (VRPSREF) 471.

Figure 6:
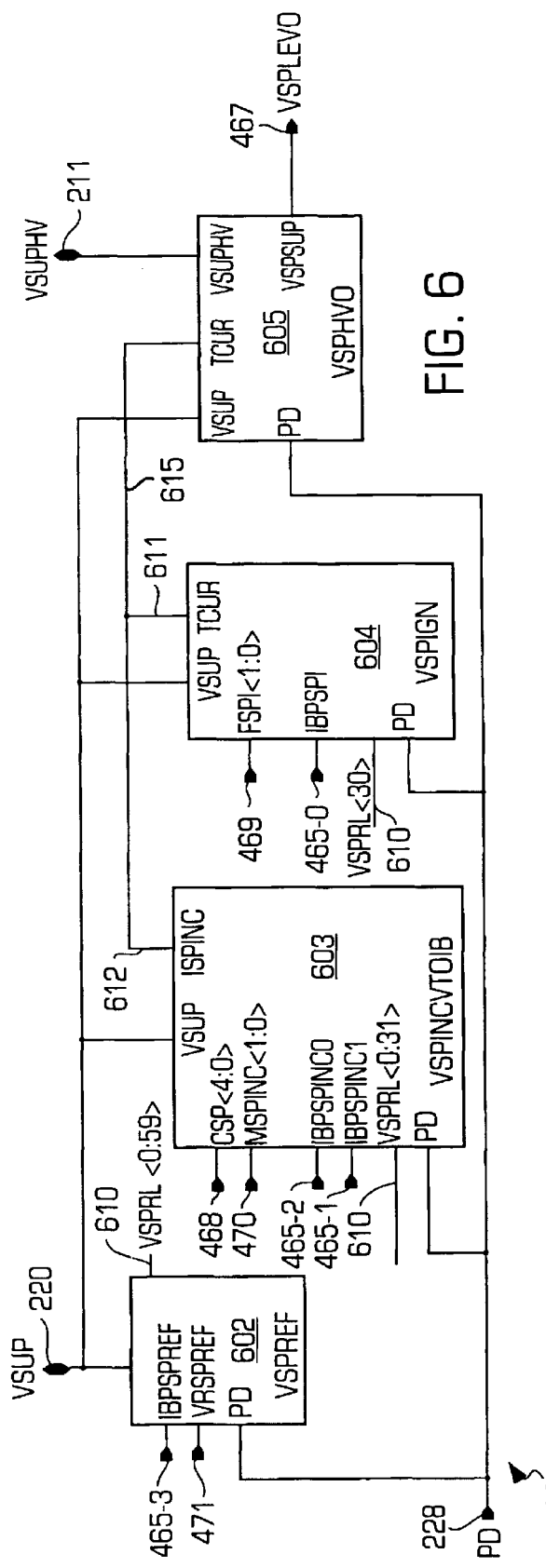
FIG. 6 is a block diagram illustrating a high voltage level generator of the high voltage pulsing circuit of FIG. 4.

FIG. 6 is a block diagram illustrating the high voltage level generator 403 of FIG. 4. The high voltage level generator 403 comprises a reference voltage generator (vspref) 602, an incremental current generator (vspincvtoib) 603, an initial current generator (vspign) 604, and a high voltage current to voltage converter (vsphvo) 605.

The reference voltage generator (vspref) 602 provides a reference voltage (VSPRL) signal 610 to the incremental current generator (vspincvtoib) 603 and the initial current generator (vspign) 604 in response to the second bias current 465-3 and the reference voltage (VRSPREF) 471. The initial current generator (vspign) 604 provides an initial current 611 to the high voltage current to voltage converter (vsphvo) 605 to control the initial high voltage level Vspi. The incremental current generator (vspincvtoib) 603 provides an incremental current 612 to the high voltage current to voltage converter (vsphvo) 605 to control incremental voltage level Vspinc. The high voltage current to voltage converter (vsphvo) 605 converts the summed current of the initial current 611 and the incremental current 612 into the high voltage (VSPLEV0) signal 467.

The reference voltage generator 602, the incremental current generator 603, and the initial current generator 604 operate at the nominal supply voltage (VSUP) 220. The high voltage current to voltage converter (vsphvo) 605 operates at the high voltage supply (VSUPHV) signal 211. The power down (PD) signal 228 controls power down of the reference voltage generator 602, the incremental current generator 603, the initial current generator 604, and the high voltage current to voltage converter 605.

Figure 7:
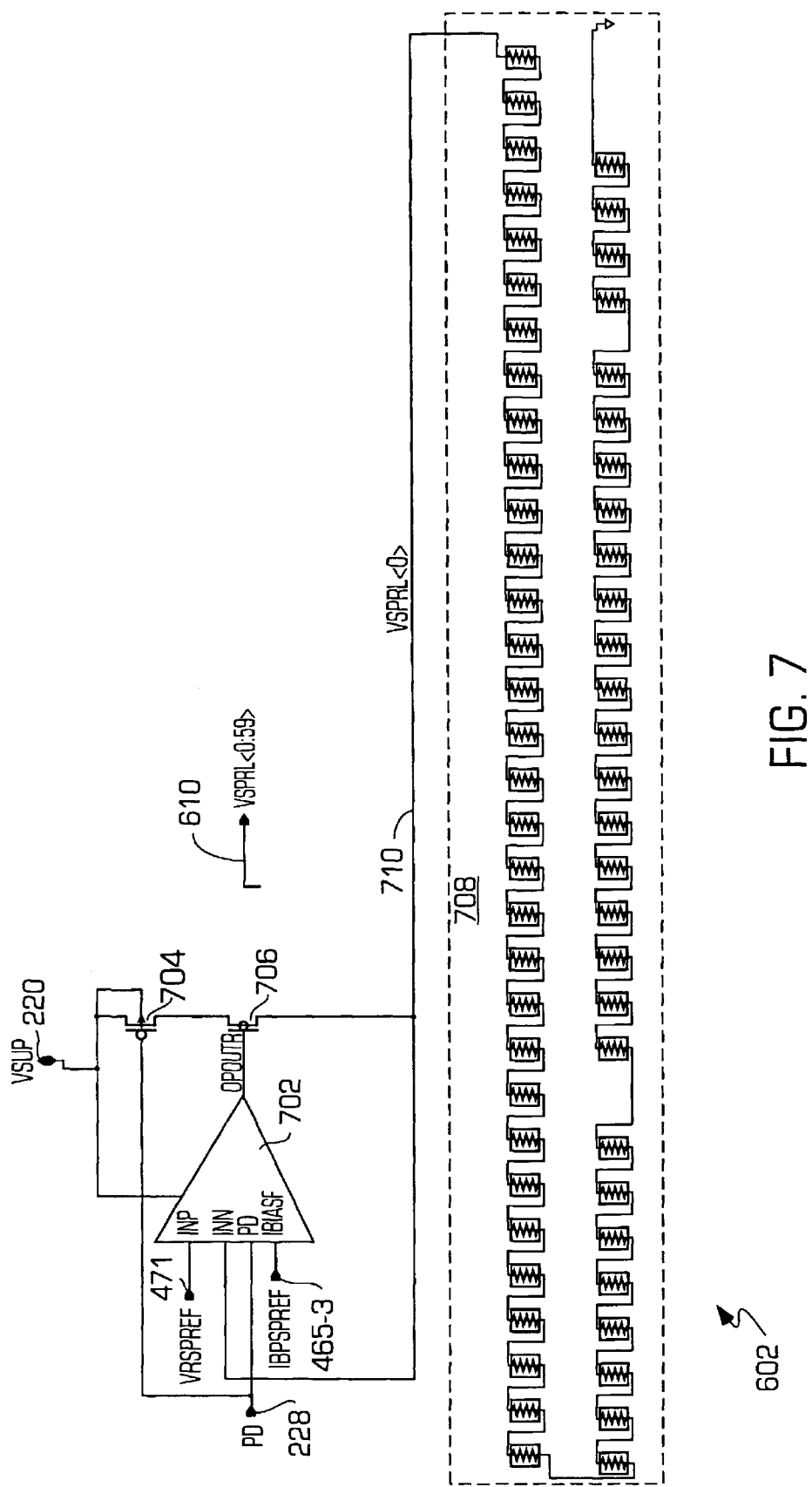
FIG. 7 is a block diagram illustrating a reference voltage generator of the high voltage level generator of FIG. 6.

FIG. 7 is a block diagram illustrating the reference voltage generator (vspref) 602.

The reference voltage generator 602 comprises a low voltage operational amplifier (opotop) 702, a PMOS transistor 704, an NZ NMOS transistor 706, and a resistor string 708.

The drain-source terminals of the PMOS transistor 704 and the NZ NMOS transistor 706, and the resistor string 706 are coupled in series between the supply voltage (VSUP) 220 and ground. The gate of the PMOS transistor 704 and the operational amplifier 702 are coupled to the power down (PD) signal 228. The PMOS transistor 704 controls power down of the reference voltage generator 602. The output of the operational amplifier 702 is coupled to the gate of the NZ NMOS transistor 706, which is configured as a source follower.

The operational amplifier 702 biases the NZ NMOS transistor 706 in response to the difference between the reference voltage (VRSPREF) 471 and a feedback signal 710 from the source of the NZ NMOS transistor 706.

The resistor string 708 comprises a plurality of resistors coupled in series to form a voltage divider. Each of the plurality of resistors generates a corresponding reference voltage (VSPRL) 610. The resistor string 708 provides negative feedback to the operational amplifier 702 to generate the reference voltages (VSPRL<0:59>) 610.

Figure 8:
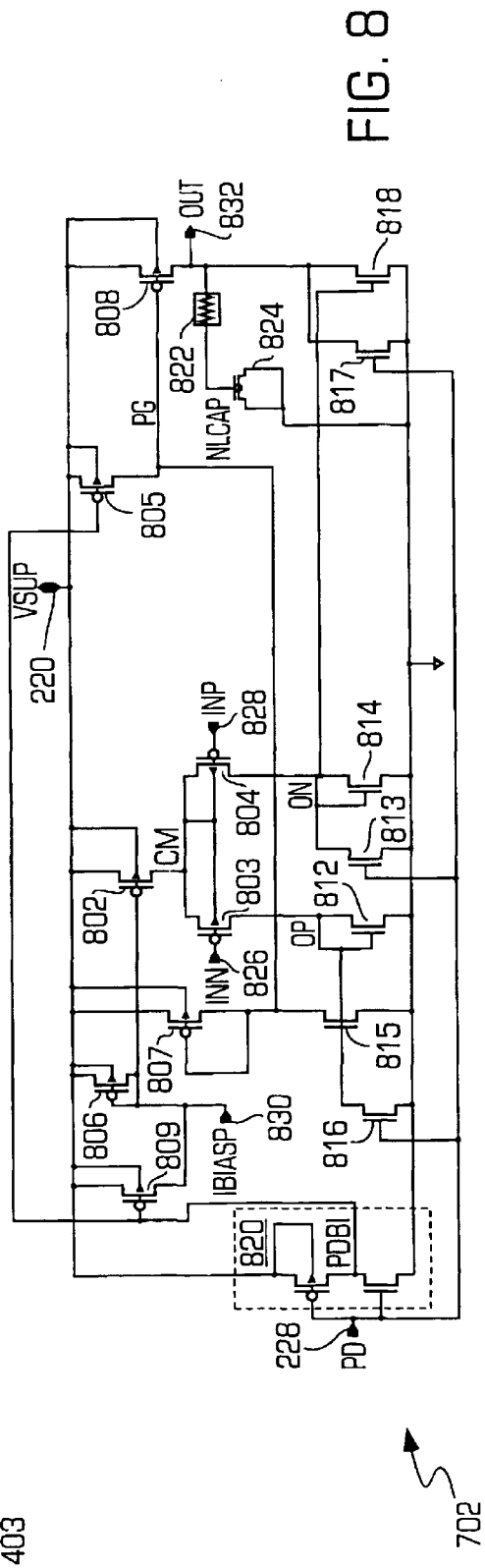
FIG. 8 is a block diagram illustrating a low voltage operational amplifier of the reference voltage generator of FIG. 7.

FIG. 8 is a block diagram illustrating the low voltage operational amplifier 702.

The low voltage operational amplifier 702 comprises a plurality of PMOS transistors 802 through 809, a plurality of N NMOS transistors 812 through 818, an inverter 820, a resistor 822, and a capacitor 824.

The low voltage operational amplifier 702 is an operational transconductance amplifier. The PMOS transistors 803, 804 are the input pair. The PMOS transistors 802, 803 and 804 and the diode-connected N NMOS transistors 812 and 814 are arranged as a differential amplifier. The PMOS transistors 803 and 804 are the input pair for receiving a down input signal (INN) 826 and an up input signal (INP) 828, respectively. In one embodiment, the bias current (IBIASP) 830 is the second bias current 465-3. The PMOS transistor 802 provides bias for the differential amplifier. The PMOS transistors 802 and 806 are biased by a bias current (IBIASP) 830. In one embodiment, the down input signal (INN) 826 is the feedback signal 710, and the up input signal (INP) 828 is the reference voltage 471. The PMOS transistor 808 and the N NMOS transistor 818 are coupled in series between the supply voltage (VSUP) 220 and ground to form an output stage having an output node 832 formed of the drains of the transistors 808 and 818. The drain-source terminals of the diode connected PMOS transistor 807 and the N NMOS transistor 815 are coupled between the supply voltage (VSUP) 220 and ground to bias the PMOS transistor 808. The drain-source terminals of the diode-connected PMOS transistor 806 are coupled between the supply voltage (VSUP) 220 and the gate of the PMOS transistor 802 to bias the PMOS transistor 802. The N NMOS transistors 814 and 818 provide the pull down for the output node 832. The NMOS transistors 812 and 815 and the PMOS transistors 807 and 808 provide the pull-up for the output node 832. The resistor 822 and the capacitor 824 are coupled in series between the output node 832 and ground for compensation.

The inverter 820, the PMOS transistors 805 and 809, and the NMOS transistors 813, 816 and 817 form a power down circuit to power down the operational amplifier 702 to zero standby current. The drain-source terminals of the PMOS transistors 809 and 805 couple the gates of the PMOS transistors 802 and 808, respectively, to the supply voltage 220 in response to the inverted power down signal from the inverter 820 applied to the gates of the PMOS transistors 809 and 805. The drain-source terminals of the N NMOS transistor 816 couple the gates of the N NMOS transistors 815 and 812 to ground in response to the power down (PD) signal 228 applied to the gate of the transistor 816. The drain-source terminals of the N NMOS transistor 817 couple the output node 832 to ground in response to the power down (PD) signal 228 applied to the gate thereof.

Refer again to FIG. 6. The initial current generator (vspign) 604 provides the initial current 611.

Figure 9:
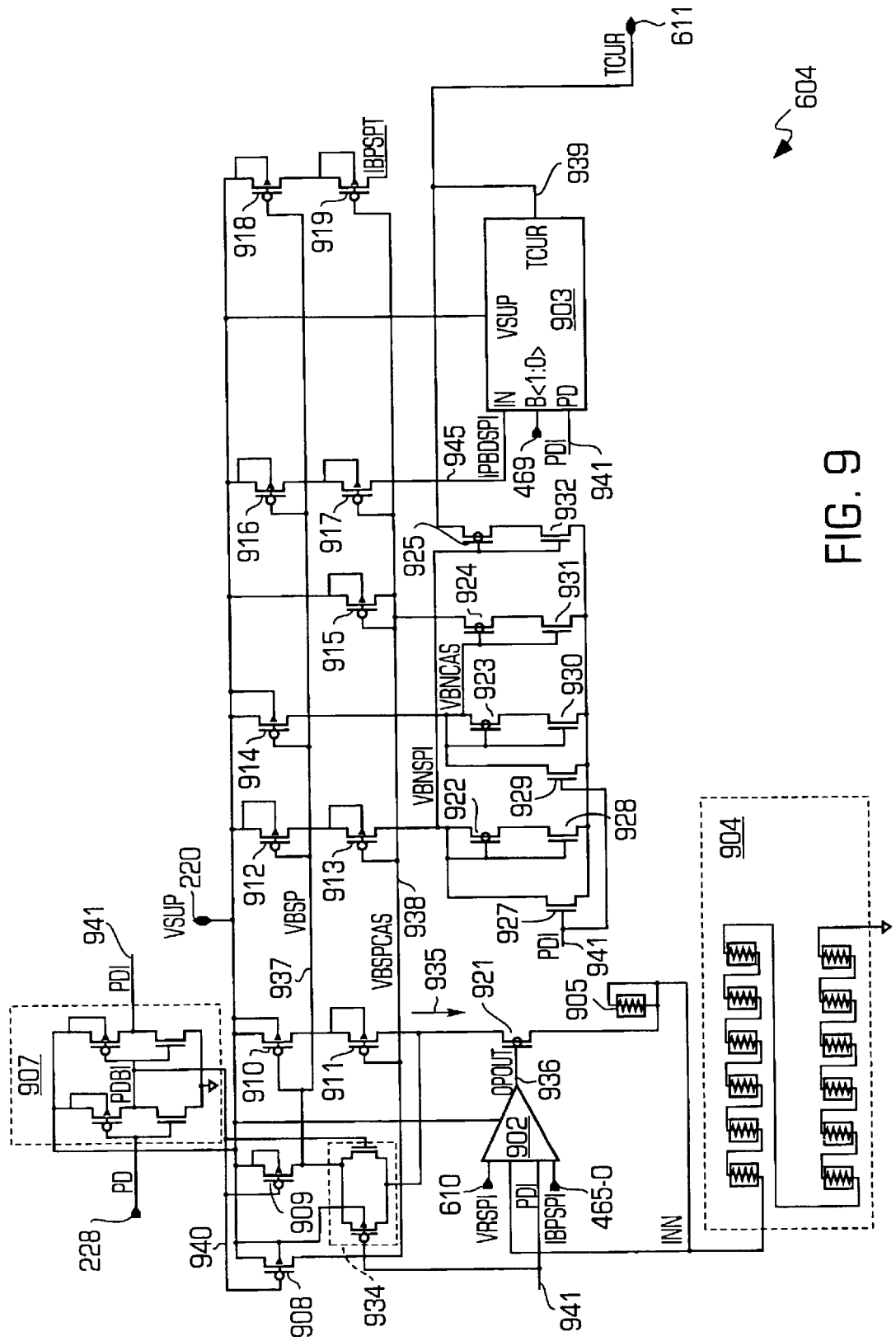
FIG. 9 is a block diagram illustrating an initial current generator of the high voltage level generator of FIG. 6.

FIG. 9 is a block diagram illustrating the initial current generator 604.

The initial current generator 604 comprises an operational amplifier (opotap) 902, a programmable trim current circuit (ntrm2c) 903, a resistor string 904, a resistor 905, a power down circuit 907, a plurality of PMOS transistors 908 through 919, a plurality of NZ NMOS transistors 921 through 925, a plurality of N NMOS transistors 927 through 932, and a transfer gate 934.

The initial current generator 604 converts the reference voltage (VSPRL) 610 into the initial current 611, which comprises a nominal current and a range of programmable currents around the nominal current. The operational amplifier 902, the NZ NMOS transistor 921, the resistor string 904, and the resistor 905 convert the reference voltage (VRSP) 610 into an output current 935 that flows through the transistors 910 and 911. The operational amplifier 902 provides the output current 936 to the gate of the NZ NMOS transistor 921, which operates as a source follower, to feedback the source of the NZ NMOS transistor 921 to an input of the operational amplifier 902. In another embodiment, the source of the NZ NMOS transistor 921 is coupled through the resistor 905 to the input of the operational amplifier 902. The input of the operational amplifier is coupled by the resistor 904 to ground. In one embodiment, the resistor 904 is matched to the resistor string 708 (FIG. 7). The operational amplifier 902 is biased by the second bias current 465-0. A power down signal 941 powers down the operational amplifier 902.

The PMOS transistors 910 and 911 are coupled in a self cascode arrangement between the supply voltage (VSUP) 220 and the drain of the NZ NMOS transistor 921 to mirror the output current 935. The PMOS transistor 910 is biased by a first voltage bias line (VBSP) 937. The PMOS transistor 911 is biased by a second voltage bias line (VBSPCAS) 938. The PMOS transistor 915, the NZ NMOS transistor 924 and the N NMOS transistor 931 include drain-source terminals coupled in series between the supply voltage 220 and ground, and provide bias for the cascode arranged PMOS transistors 910 and 911. The drain and gate of the PMOS transistor 915 are coupled to the second voltage bias (VBSPCAS) line 938.

The drain-source terminals of the PMOS transistor 914, the NZ NMOS transistor 923 and the N NMOS transistor 930 are coupled in series between the supply voltage (VSUP) 220 and ground. The gates of the NMOS transistors 923, 924, 930, 931 are coupled to each other and to the drain of the PMOS transistor 914 to bias the NMOS transistors 924 and 931.

The drain-source terminals of the PMOS transistors 912 and 913 and the NZ NMOS transistor 522 and the N NMOS transistor 528 are coupled in series between the supply voltage (VSUP) 220 and ground. The gates of the PMOS transistors 912 and 913 are biased by the first voltage bias (VBSP) line 937 and the second voltage bias (VBSPCAS) line 938, respectively. The drain-source terminals of the NZ NMOS transistor 925 and the N NMOS transistor 932 are coupled in series between the initial current line 611 and ground. The NMOS transistors 522, 525, 528 and 532 have gates coupled to each other and to the drain of the PMOS transistor 913. The transistors 912, 913, 922, 925, 928 and 932 provide the nominal initial current for the high voltage. The trim current circuit 903 provides a programmable range of current 939 around the nominal current for the initial current 611. The PMOS transistors 916 and 917 are coupled in a cascode arrangement between the supply voltage (VSUP) 220 and a programmable bias line 945, which is coupled to the programmable trim current circuit 903. The gates of the PMOS transistors 916 and 917 are biased by the first voltage bias (VBSP) line 937 and the second voltage bias (VBSPCAS) line 938, respectively. The PMOS transistors 918 and 919 provide a test point for the circuit.

The power down circuit 907, the PMOS transistors 908 and 909, the N NMOS transistors 927 and 929, and the transfer gate 934 control power down of the initial current generator 604 to a zero current. The power down circuit 907 generates an inverted power down (PDBI) signal 940 and a power down (PDI) signal 941 in response to the power down signal 228. The drain-source terminals of the NMOS transistor 927 are coupled between the common node formed of the NZ NMOS transistor 922 and the NMOS transistor 928 and the ground in response to the power down signal 941 applied to the gate of the NMOS transistor 927. The NMOS transistor 929 similarly grounds the gates of the NMOS transistor 923 and 930. The PMOS transistor 908 includes drain-source terminals coupled between the supply voltage (VSUP) 220 and the second voltage bias (VBSPCAS) line 938, and includes a gate coupled to receive the inverted power down (PDBI) signal 940. The drain-source terminals of the PMOS transistor 909 couple the supply voltage (VSUP) 220 to the first voltage bias (VBSP) line 937 in response to the inverted power down (PDI) signal 941 applied to the gate thereof. The transfer gate 934 couples the first voltage bias (VBSP) line 937 to the drain of PMOS transistor 911 in response to the power down signal (PDI) 941 being low and the power down (PDI) signal 941 being high.

Figure 10:
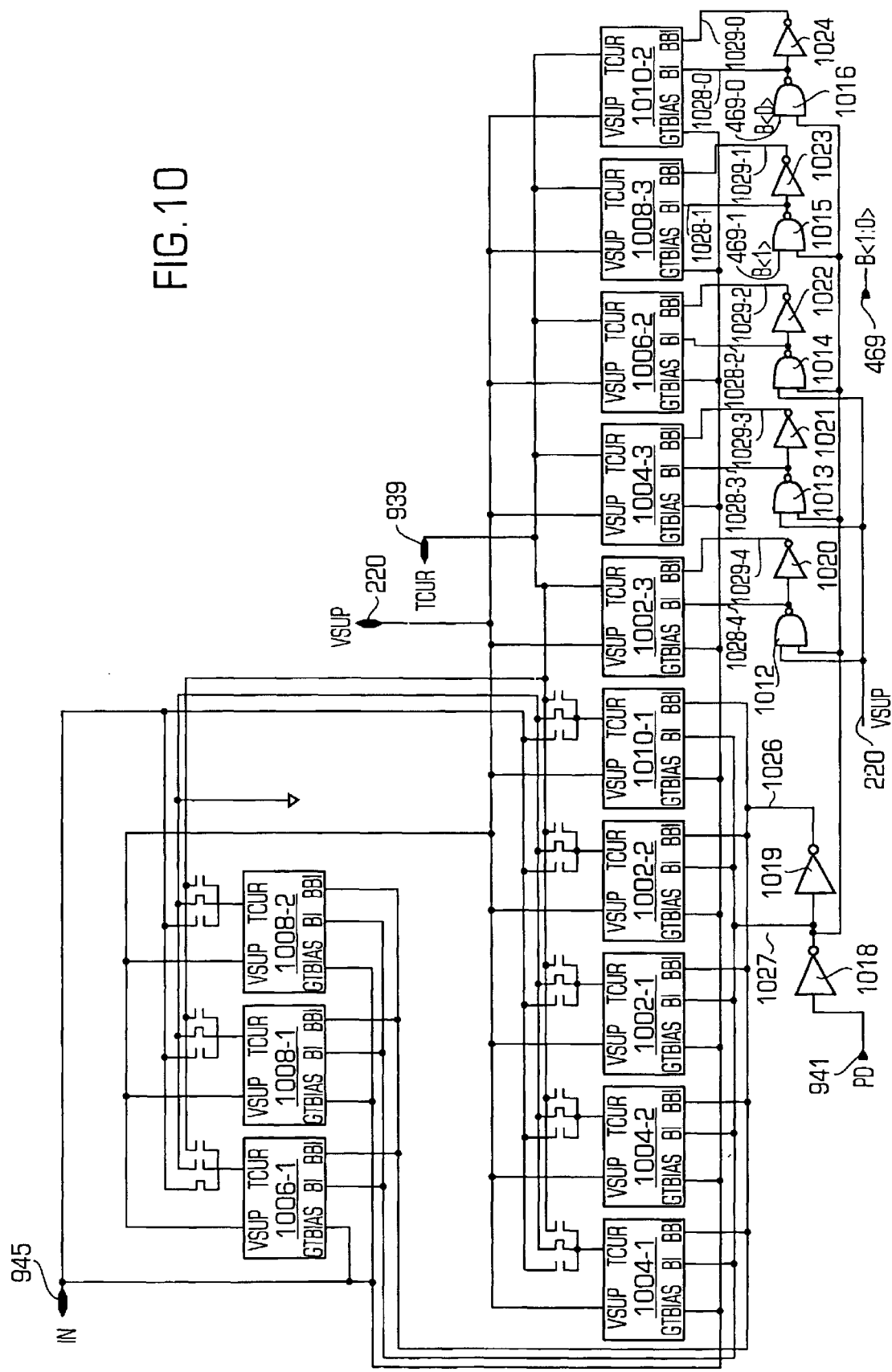
FIG. 10 is a block diagram illustrating a programmable trim current circuit of the initial current generator of FIG. 9.

FIG. 10 is a block diagram illustrating a programmable trim current circuit 903.

The programmable trim current circuit 903 comprises a plurality of 16× unit bias current circuits 1002-1 through 1002-3, a plurality of 8× unit bias current circuits 1004-1 through 1004-3, a plurality of 4× unit bias current circuits 1006-1 and 1006-2, a plurality of 2× unit bias current circuits 1008-1 through 1008-3, a plurality of 1× unit bias current circuits 1010-1 and 1010-2, a plurality of NAND gates 1012 through 1016, and a plurality of inverters 1018 through 1024.

The programmable trim current circuit 903 shown in FIG. 10 includes a five bit control range of current about a nominal current. Other numbers of bits of control range may be selected.

The 1× unit bias current circuit 1010-2 provide a unit current bias on the programmable (TCVR) current 939. The 16× unit bias current circuit 1002-3, the 8× unit bias current circuit 1004-3, the 4× unit bias current circuit 1006-2, and the 2× unit bias current circuit 1008-3 provide sixteen-times (16×) unit current bias, eight-times (8×) unit current bias, four-times (4×) unit current bias, and two-times (2×) unit current bias, respectively, on the programmable (TCVR) current 939. The 16× unit bias current circuits 1002, the 8× unit bias current circuits 1004, the 4× unit bias current circuits 1006, the 2× unit bias current circuits 1008, and the 1× unit bias current circuits 1010 are coupled to the programmable bias (IPBDSPI) line 945. The outputs of the 16× unit bias current circuits 1002, the 8× unit bias current circuits 1004, the 4× unit bias current circuits 1006, the 2× unit bias current circuits 1008, and the 1× unit bias current circuits 1010 are selectively coupled to the programmable (TCVR) current 939 for bit digital control. In one embodiment, the selective coupling is by signal lines, such as metal lines, in an integrated circuit. In another embodiment, the selective coupling is by switches, such as MOS transistors.

The inverters 1018 and 1019 provide a power down signal 1026 and an inverted power down signal 1027 for powering down the 16× unit bias current circuits 1002, the 8× unit bias current circuits 1004, the 4× unit bias current circuits 1006, the 2× unit bias current circuits 1008, and the 1× unit bias current circuits 1010, in response to the power down (PDI) signal 941. The NAND gate 1012 and the inverter 1020 generate a trim current select (BI) signal 1028-4 and an inverted trim current select (BBI) 1029-4 for controlling the selection of the biasing of the 16× unit bias current circuit 1002-3. The NAND gate 1013 and the inverter 1021 generate a trim current select (BI) 1028-3 and an inverted trim current select (BBI) 1029-3 for controlling the selection of the biasing of the 8× unit bias current circuit 1004-3. The NAND gate 1014 and the inverter 1022 generate a trim current select (BI) 1028-2 and an inverted trim current select (BBI) 1029-2 for controlling the selection of the biasing of the 4× unit bias current circuit 1006-2. The NAND gates 1012, 1013 and 1014 are enabled or disabled by the power down signal 941. The other input of the NAND gates 1012, 1013, 1014 is coupled to the supply voltage (VSUP) 220. The 2× unit bias current circuit 1008-3 and the 1× unit bias current circuit 1010-2 provide trim currents controlled by the trim initial current select (B<1>) signal 469-1 and trim initial current select (B<0>) signal 469-0, respectively. The NAND gate 1015 and the inverter 1023 generate a trim current select (BI) 1028-1 and an inverted trim current select (BBI) 1029-1 for controlling the selection of the biasing of the 2× unit bias current circuit 1008-3, in response to the trim current select (B<1>) signal 469-1. The NAND gate 1016 and the inverter 1024 generate a trim initial current select (BI) 1028-0 and an inverted trim current select (BBI) 1029-0 for controlling the selection of the biasing of the 1× unit bias current circuit 1010-2, in response to the trim initial current select (B<0>) signal 469-0. As shown, any combination of the current circuits 1006-1, 1008-1, 1008-2, 1004-1, 1004-2, 1002-1, 1002-2, and 1010-1 can be enabled to set up a master bias voltage around which the rest of remaining current blocks may mirror from. The enabling is done by connecting (closing) the shown metal option to the bias line 945 and opening other two metal options to the ground line and the current line 939. After setting up the master bias voltage, any combination of the rest of the current circuits 1006-1, 1008-1, 1008-2, 1004-1, 1004-2, 1002-1, 1002-2, and 1010-1 can be enabled to set up a nominal bias current around which other current circuits 1002-3, 1004-3, 1006-2, 1008-3, 1010-02 may create a trim range. The enabling is done by connecting (closing) the shown metal option to the current line 939 and opening other two metal options to the ground line and the bias line 945.

Figure 11:
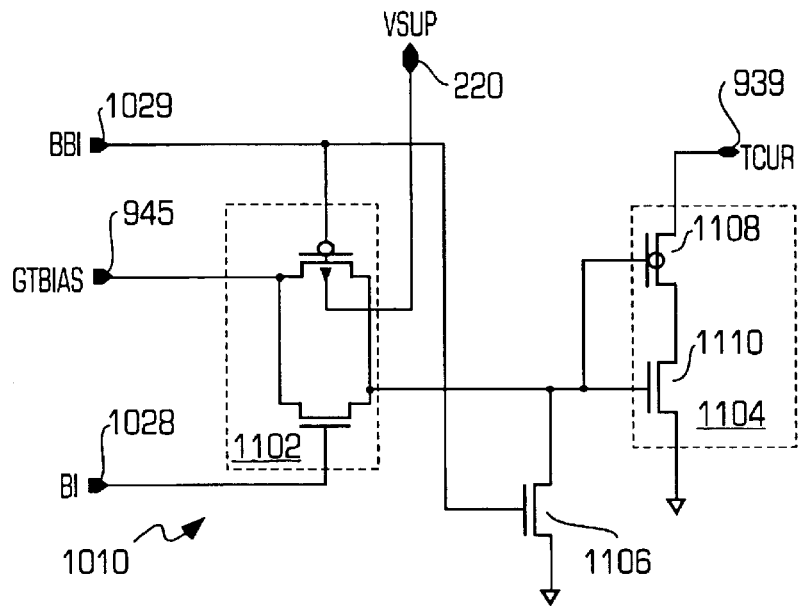
FIG. 11 is a block diagram illustrating a unit bias current circuit of the programmable trim current circuit of FIG. 10.

FIG. 11 is a block diagram illustrating the unit bias current circuit 1010.

The 16× unit bias current circuits 1002, the 8× unit bias current circuits 1004, the 4× unit bias current circuits 1006, and the 2× unit bias current circuits 1008 operate in a similar manner as the 1× unit bias current circuits 1010. For simplicity and clarify of illustration, only the 1× unit bias current circuit 1010 is described.

The trim current circuit 1010 comprises a transfer gate 1102, a current cascode 1104, and an NMOS transistor 1106. The current cascode 1104 provides the trim or adjustment of the bias on the programmable current (TCVR) line 939. The current cascode 1104 comprises an NZ NMOS transistor 1108 and an N NMOS transistor 1110 coupled between the programmable current line 939 and ground. The gates of the NZ NMOS transistor 1108 and the N NMOS transistor 1110 are coupled to each other and to the transfer gate 1102. In response to the trim current select (BI) 1028 and the inverted trim current select (BBI) 1029, the transfer gate 1102 couples the programmable bias current 945 to the common node formed of the gates of the transistors 1108 and 1110 to control the biasing thereof. The NMOS transistor 1106 includes drain-source terminals coupled between the common node formed of the gates of the transistors 1108 and 1110 and ground to ground the current cascode 1104 in response to the inverted trim current select (BBI) signal 1029.

Refer again to FIG. 6. The incremental current generator (vspinctvoib) 603 generates the incremental current 612.

Figure 12:
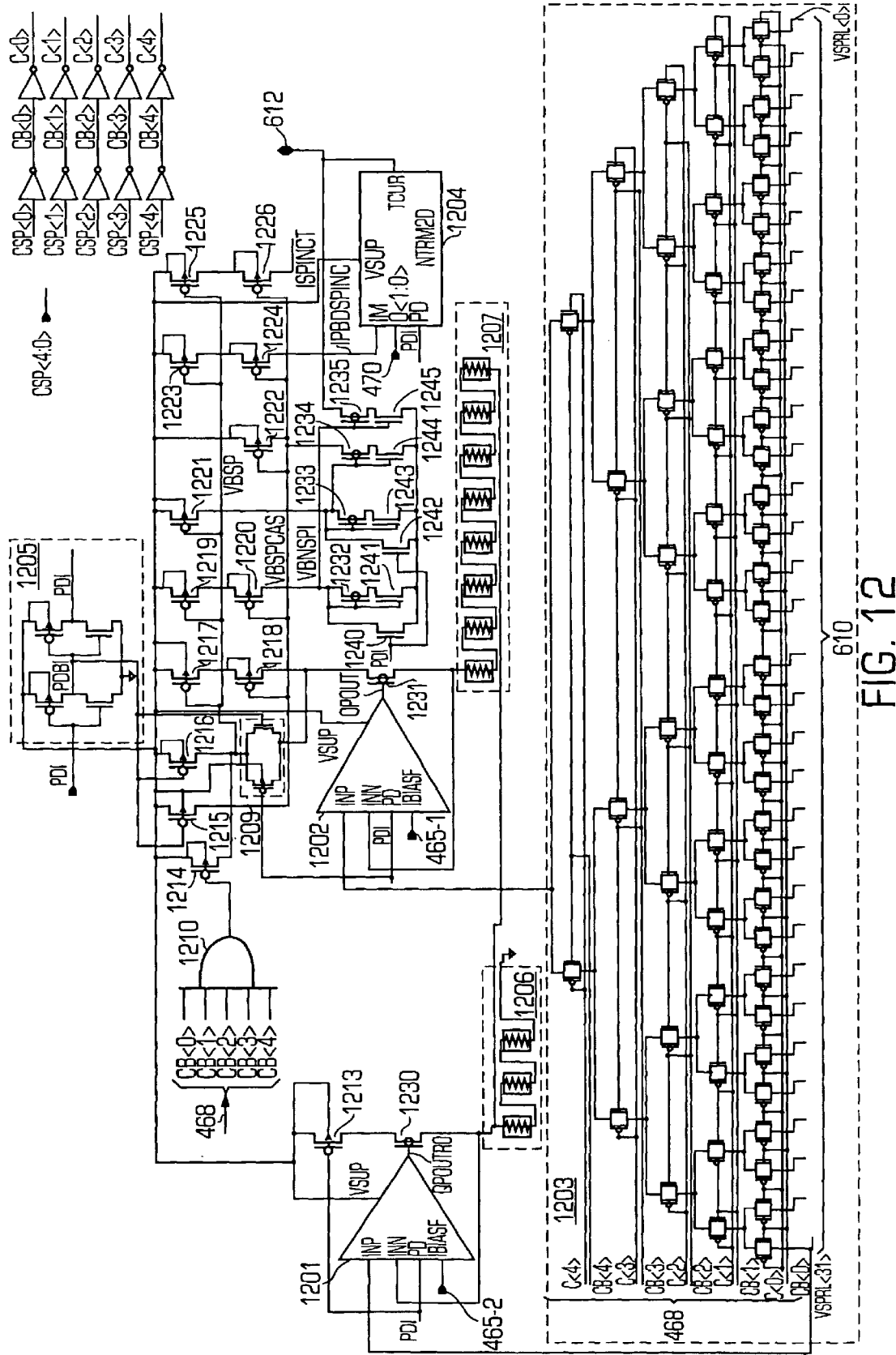
FIG. 12 is a block diagram illustrating an incremental current generator of the high voltage level generator of FIG. 6.

FIG. 12 is a block diagram illustrating the incremental current generator (yspinctvoib) 603.

The incremental current generator (vspinctvoib) 603 comprises operational amplifiers 1201 and 1202, a switch circuit 1203, a trim circuit 1204, a power down circuit 1205, a plurality of resistors 1206 through 1207, a transfer gate 1209, a NAND gate 1210, a plurality of PMOS transistors 1213 through 1226, a plurality of NZ NMOS transistors 1230 through 1235, and a plurality of N NMOS transistors 1240 through 1245.

The incremental current generator 603 converts a delta voltage into a current. The incremental current generator 603 operates in a manner similar to the initial current generator 604.

The operational amplifier 1201, the PMOS transistor 1213, the NZ NMOS transistor 1230 are arranged in a manner similar to the operational amplifier 702, the PMOS transistor 704, the NZ NMOS transistor 706 of FIG. 7.

The PMOS transistors 1215 through 1226 are arranged and operate in a manner similar to the respective PMOS transistors 908 through 919 of FIG. 9. The NZ NMOS transistors 1232 through 1235 are arranged and operate in a manner similar to the respective NZ NMOS transistors 922 through 925. The N NMOS transistors 1240 through 1244 are arranged to operate in a manner similar to the respective N NMOS transistors 927 through 932. The power down circuit 1205 and the transfer gate 1209 are arranged to operate in a manner similar to the power down circuit 907 and the transfer gate 934, respectively.

The operational amplifier 1202, the NZ NMOS transistor 1231 and the resistor 1207 are arranged in a manner similar to the operational amplifier 702, the NZ NMOS transistor 706 and the resistor 708 at FIG. 7, except the resistor 1027 is coupled to the common node formed of the input of the operational amplifier 1201 and the resistor 1206.

The switch circuit 1203 decodes the reference voltage select (CSP) signal 468 to select one of the reference voltages (VSPRL) 610. The selected reference voltages (VSPRL) 610 is applied to a first input of the operational amplifier 1202. The feedback from the source-follower arranged NZ NMOS transistor 1231 is applied to a second input of the operational amplifier 1202. The operational amplifiers 1201 and 1202 are biased by the second bias currents 465-2 and 465-1, respectively. The reference voltage 610 is a delta voltage that is converted into the incremental current 612. The NAND gate 1210 is enabled by the inverted reference voltage select signals 468 to bias the PMOS transistor 1214 that includes drain-source terminals coupled between the supply voltage 220 and a bias line coupled to the PMOS transistor 1217. The programmable trim current circuit 1204 is arranged and operates in a manner similar to the programmable trim current circuit 903. The selection of the programmable trim current is controlled by the incremental current select (MSPINC) signal 470 applied to the programmable trim current circuit 1204.

Refer again to FIG. 6. The high voltage current to voltage converter 605 converts a summed current 615 of the initial current 611 and the incremental current 612 into the high voltage (VSPLEVO) signal 467.

Figure 13:
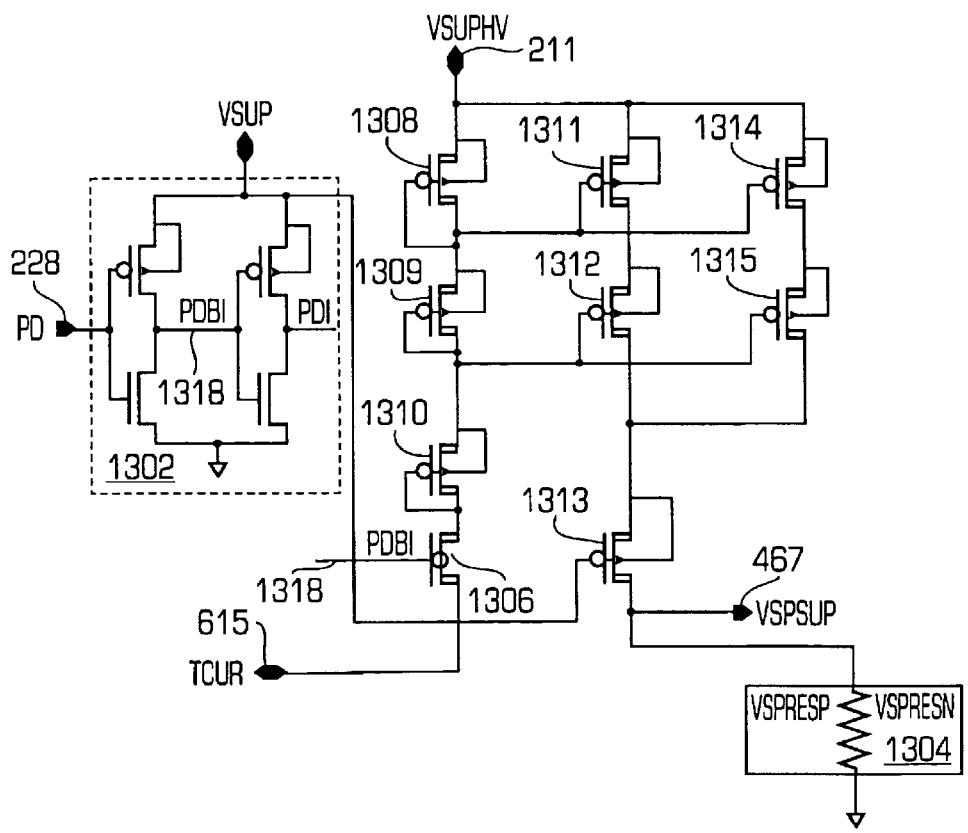
FIG. 13 is a block diagram illustrating a high voltage current to voltage converter of the high voltage level generator of FIG. 6.

FIG. 13 is a block diagram illustrating a high voltage current to voltage converter 605.

The high voltage current to voltage converter 605 comprises a power down signal generator 1302, a resistor 1304, an NX NMOS transistor 1306, and a plurality of PMOS transistors 1308 through 1315.

The high voltage current to voltage converter 605 comprises minimum high voltage devices for high voltage level generation. The drain-source terminals of the PMOS transistors 1308, 1309, and 1310 and the NX NMOS transistor 1306 are coupled in series between the high voltage supply signal (VSUPHV) 211 and the summed current 615. The PMOS transistors 1308, 1309, and 1310 are diode connected.

The NX NMOS transistor 1306 powers down the high voltage section. The gate of the NX NMOS transistor 1306 is coupled to the power down signal generator 1302, which generates an inverted power down (PDBI) signal 1318 in response to the power down (PD) signal 228.

The drain-source terminals of the PMOS transistors 1311, 1312, and 1313 and the resistor 1304 are coupled in series between the high voltage supply signal (VSUPHV) 211 and ground. The gates of the PMOS transistors 1311 and 1312 are coupled to the drains of the PMOS transistors 1308 and 1309, respectively. The drain-source terminals of the PMOS transistors 1314 and 1315 are coupled in series between the high voltage supply signal (VSUPHV) 711 and the drain of the PMOS transistor 1312. The gates of the PMOS transistors 1314 and 1315 are coupled to the drains of the PMOS transistors 1308 and 1309, respectively.

The PMOS transistors 1308 and 1309 form a current mirror and set a bias voltage. The PMOS transistors 1311, 1312, 1314 and 1315 provide a summed current to the resistor 1304, to generate the high voltage (VSPLEVO) signal 467. In one embodiment, the resistor 1304 is matched to the resistor 1207 (see FIG. 12), the resistor 904 (see FIG. 9) and the resistor string 708 (see FIG. 7).

The PMOS transistors 1310 and 1313 and the NX NMOS transistor 1306 protect the PMOS transistors 1308, 1309, 1311, 1312, 1314 and 1315 from too high of a voltage on any of their two transistor terminals. They also protect the low voltage circuits (elements 603 and 604) from the high voltage.

Refer again to FIG. 4. The high voltage (VSPLEV0) signal 467 from the high voltage level generator 403 is filtered by the filter 417. In one embodiment, the filter 417 is a resistor capacitor filter. The filtered high voltage signal 467 is coupled through the NX NMOS transistors 427 and 428 to the operational amplifier 404 as a step input voltage (VSPIN) 472. The NX NMOS transistor 427 is enabled by the low high voltage supply (VSUPHVLS) signal 212.

The operational amplifier 404 may be, for example, the high voltage operational amplifier described in U.S. patent application Ser. No. 09/960,589, entitled "Folded cascode high voltage operational amplifier with class AB source follower output stage", filed Oct. 19, 2001, the subject matter of which is incorporated herein by reference.

The output 473 of the operational amplifier 404 is provided through the transfer gate 422 as the pulsed high voltage (VSPD) signal 213. The transfer gate 422 is controlled by the high voltage level shifter 411 which is controlled by an enable high voltage output (ENVSPHIGH) signal 474 through the buffer 461.

The operational amplifier 404 may be operated in a closed nested loop. In one embodiment, the close nested loop is an overlapped driven closed loop. The nested loop refers to a local closed loop (as provided by the transfer gate 421) in combination with a global closed loop (as provided by the transistor gates 423 and 422). An output (VSP) 473 of the operational amplifier 404 is fed back through the transfer gate 421 to another input of the amplifier 404 to close the local loop of the operational amplifier 404. The overlap between the local loop and the global loop of high voltage driving prevents the operational amplifier 404 from going into an open loop condition. This could have an adverse effect of causing various internal nodes of the operational amplifier 404 to go into abnormal high voltage conditions to thereby cause the MOS devices therein to break down. Another adverse effect of going from open loop to closed loop is slow response speed from additional settling time. This is due to, for example, from recovering from an open loop condition. The transfer gate 421 is controlled by the high voltage level shifter 410 which is controlled by an enable voltage loop (ENVSBLP) signal 475. The enabling timing of the local loop (as provided by the transfer gate 421) has a relation to the ramping down of the pulsed high voltage (VSPD) signal 213 to not cause an overshoot at the trailing edge of the pulsed high voltage (VSPD) signal 213. The local loop is to be enabled just before the action of ramping down is enabled. Then slightly after enabling the ramping down, then the enabling of the middle level is activated.

The high voltage level shifter 405 enables the transfer gate 418 to read out or output the pulsed high voltage (VSPD) signal 213 as a test output 478. (The high voltage level shifters 405, 406, 407, 408, 409, 410, 411, 412, 413 are described below in conjunction with FIG. 16.) The high voltage level shifter 406 enables the transfer gate 419 to write in or input the pulsed high voltage (VSPD) signal 213 as a test input 479. The high voltage level shifter 407 enables the transfer gate 420 to read out or output the pulsed output high voltage (VSPS) 477 as the test output 478. In another embodiment, the pulsed high voltage (VSPD) signal 213 and the pulsed output high voltage (VSPS) 477 are read as different test terminals.

The transfer gate 423 couples the feedback voltage applied to the other input of the operational amplifier 404 to provide a pulsed output high voltage (VSPS) signal 475. The high voltage level shifter 411 controls the transfer gate 423. The drain-source terminals of the NH NMOS transistors 443 and 444 are coupled in series between the pulsed high voltage signal 213 and ground. The drain-source terminals of the NH NMOS transistors 441 and 442 are coupled in series between the pulsed output high voltage (VSPS) 477 and ground. The low high voltage supply (VSUPVLSHVLS) signal 212 is applied to the gates of the NH NMOS transistors 441 and 443. An enable pulse voltage low (ENVSPLOW) signal 476 is applied to the gates of the NH NMOS transistors 442 and 444. The NH NMOS transistors 441 and 442 drive the pulsed output high voltage 477 to ground. The NH NMOS transistors 443 and 444 drives the pulsed high voltage signal 213 to ground.

The NH NMOS transistors 445 and 446 drive the pulsed high voltage signal 213 to a middle voltage, such as VDD. The NH NMOS transistors 447 and 448 drive the pulsed output high voltage 477 to a middle voltage, such as VDD. The drain-source terminals of the NH NMOS transistors 445 and 446 are coupled between the pulsed high voltage signal 213 and the supply voltage (VSUP) 220. The drain-source terminals of the NH NMOS transistors 447 and 448 are coupled between the pulsed output high voltage (VSPS) 477 and the supply voltage (VSUP) 220. The gates of the NH NMOS transistors 445 and 447 are biased by the low high voltage supply (VSUPHVLS) signal 212. The gates of the NH NMOS transistors 446 and 448 are biased by the high voltage level shifter 413, which is enabled by the OR gate 454. An enable middle voltage pulsed (ENVSPDMID) signal 480 is applied to a first input of the OR gate 454. A first enable middle voltage pulsed (ENVSPMID1) signal 481 is applied to the delay circuit 425 and to a first input of the AND gate 451. The output of the delay circuit 425 is applied to a second input of the AND gate 451, which provides an output signal to the second input of the OR gate 454. The delay circuit 425 provides a delay on the middle voltage to allow the pulsed high voltage (VSPD) signal 213 to ramp down smoothly (by the ramp down circuit 416) before the hard pull down (by the transistors 445 and 446) is enabled.

The ramp up control circuit 415 and the OR gate 455 control the ramp up of the step input voltage 472 applied to the operational amplifier 404 to prevent the input from causing the operational amplifier 404 to overshoot and to prevent breakdown of transistors and other MOS devices in the discharge path due to uncontrollable high voltages in the fast up switching.

The ramp up control circuit 415 is controlled by the OR gate 455, the first bias current (IBNSPRMU) 464-0 and the power down (PD) signal 228. The OR gate 457 provides a first input of the OR gate 455. The OR gate 457 generates the OR of the enabled middle voltage pulsed (ENVSPDMID) signal 480 and a second enable middle voltage pulsed (ENVSPMID2) signal 482. The OR gate 455 generates an OR of the output of the OR gate 457 and the buffered enable high voltage output (ENVSPHIGH) signal 474 from the buffer 461.

Figure 14:
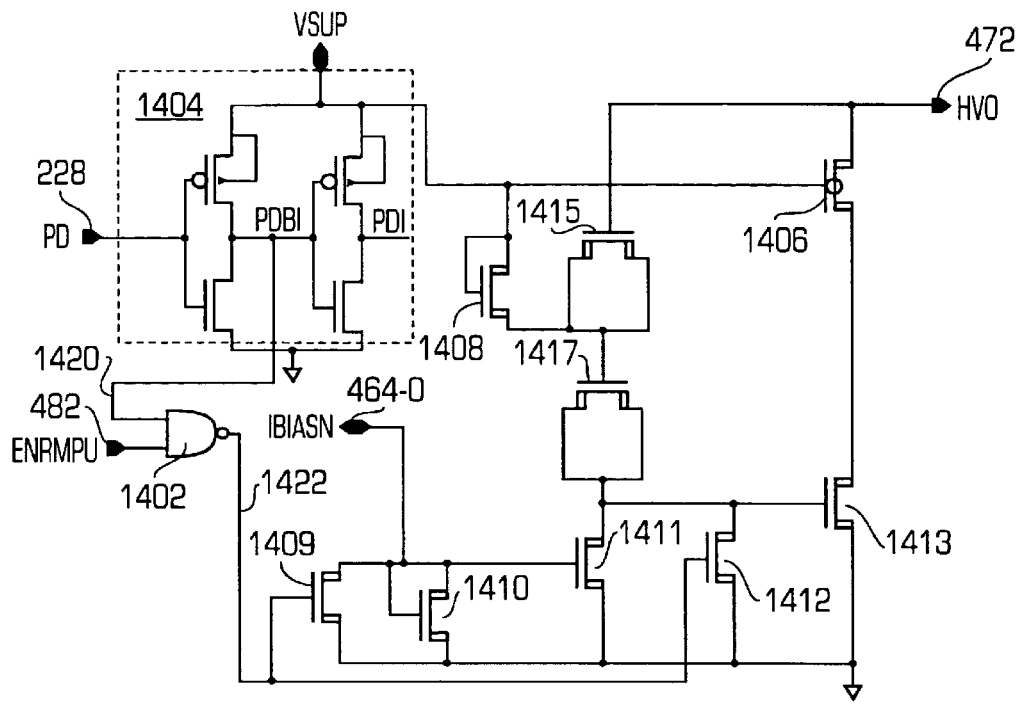
FIG. 14 is a block diagram illustrating a ramp up control circuit of the high voltage pulsing circuit of FIG. 4.

FIG. 14 is a block diagram illustrating the ramp up control circuit 415.

The ramp-up control circuit (vsprmpu) 415 comprises a NAND gate 1402, a power down signal generator 1404, an NX NMOS transistor 1406, a plurality of NH transistors 1408 through 1413, and a plurality of capacitors 1415 and 1417.

The ramp up control circuit 415 smoothly controls the ramping up of the step input voltage 472 applied to the operational amplifier 404 to avoid overshoot and also to prevent high current flowing condition in the high voltage devices due to a fast ramp up. The ramp up control circuit 415 also avoids the abnormal out of range high voltage condition occurring in the high voltage devices due to uncontrolled response due to fast ramp up.

The drain-source terminals of the NX NMOS transistor 1406 and the NH NMOS transistor 1413 are coupled in series between the step input voltage 472 and ground to control the ramping up of the step input voltage 472 by shunting current through the transistors 1406 and 1413.

The drain-source terminals of the NH NMOS transistor 1411 is coupled between the gate of the NH NMOS transistor 1413 and ground. The first bias current (IBNSPRMU) 464-0 is applied to the gate of the NH NMOS transistor 1411. The drain-source terminals of the NH NMOS transistor 1410 is coupled between the gate of the NH NMOS transistor 1411 and ground. The gate and the drain of the NH NMOS transistor 1410 are coupled to each other. The capacitors 1415 and 1417 are coupled in series between the step input voltage 472 and the gate of the NH NMOS transistor 1413. The drain-source terminals of the NH NMOS transistor 1408 is coupled between a common node formed by the gate of the NX NMOS transistor 1406 and the power supply (VSUP) and a common node formed by the coupling of the capacitors 1415 and 1417.

The NH NMOS transistors 1410 and 1411 control the bias current on the NH NMOS transistor 1413. The capacitors 1415 and 1417 and the bias current from the NH NMOS transistors 1410 and 1411 control the shunting of the NX NMOS transistor 1406 and the NH NMOS transistor 1413 and the ramping up of the step input voltage 472. The NX NMOS transistor 1406 and the series connected capacitors 1415 and 1417 buffer the high voltage on the NH NMOS transistor 1413. The NH NMOS transistor 1408 holds the voltage on the capacitor 1417 at VDD-VTNH to protect the capacitor 1417 from discharge to ground. The NH NMOS transistor 1408 also keeps the gate from having a voltage less than ground when the step input voltage 472 is discharged to ground through capacitive coupling from the capacitor 1415. This could forward bias the n+/p source drain junction that could inject carriers into the substrate, resulting in uncontrollable coupling noise.

The NAND gate 1402, the power down signal generator 1404, and the NH NMOS transistors 1409 and 1412 power down the ramp up control circuit (vsprmpu) 415 to a zero standby current. The power down signal generator 1404 generates an inverted power down (PDBI) signal 1420 in response to the power down (PD) signal 228. The NAND gate 1402 generates a power down enable signal 1422 in response to the inverted power down (PDBI) signal 1420 and the enable ramp up (ENRMPU) signal 482. The drain-source terminals of the NH NMOS transistor 1412 couple the gate of the NH NMOS transistor 1413 to ground in response to the power down enable signal 1422 applied to the gate of the NH NMOS transistor 1412 to disable the NH NMOS transistor 1413 during power down. The drain-source terminals of the NH NMOS transistor 1409 couple the gate of the NH NMOS transistor 1411 to ground in response to the power down enable signal 1422 applied to the gate of the NH NMOS transistor 1409 to disable the NH NMOS transistor 1411 during power down.

Refer again to FIG. 4. The ramp down control circuit 416 and the buffer 462 control the ramp down of the pulsed high voltage (VSPD) signal 213 to prevent the break down of transistors and other MOS devices in the discharge path due to high current switching at high voltage and due to uncontrollable high voltages in the fast down switching.

Figure 15:
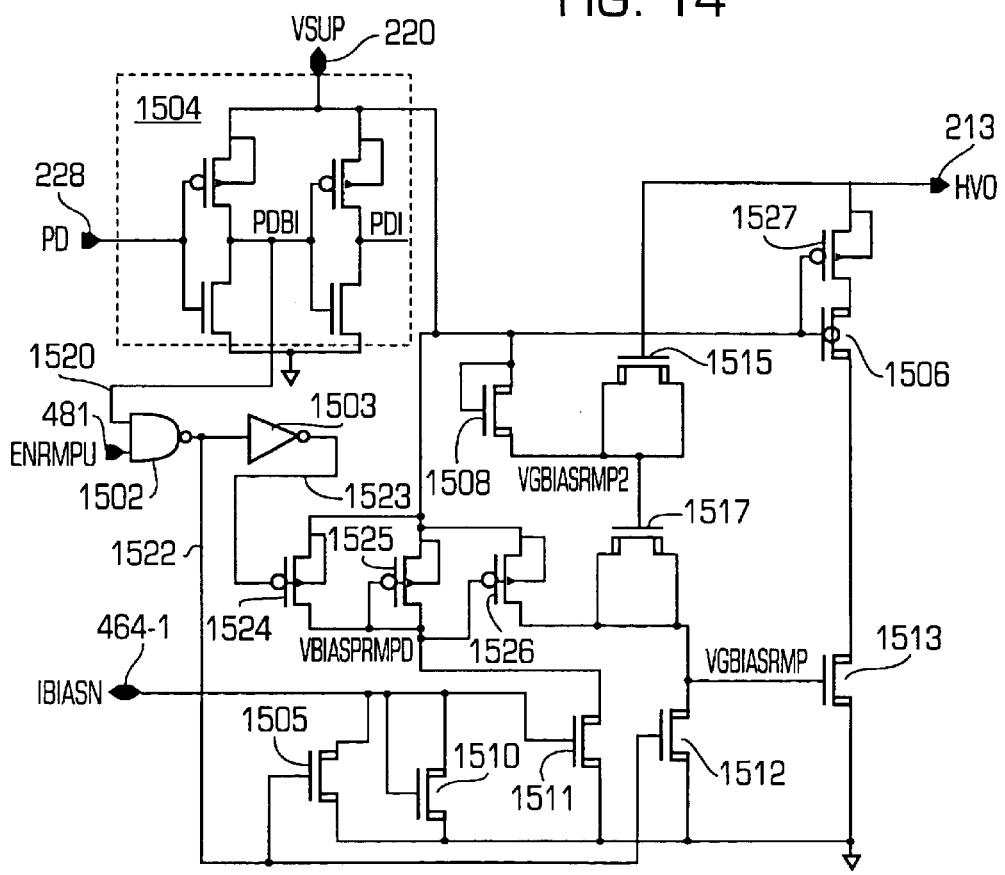
FIG. 15 is a block diagram illustrating a ramp down circuit of the high voltage pulsing circuit of FIG. 4.

FIG. 15 is a block diagram illustrating the ramp down circuit 416.

The ramp-down control circuit (vsprmpd) 416 comprises a NAND gate 1502, an inverter 1503, a power down signal generator 1504, an NX NMOS transistor 1506, a plurality of NH NMOS transistors 1508 through 1513, a plurality of capacitors 1515 and 1517, and a plurality of P PMOS transistors 1524 through 1526, and a PH PMOS transistor 1527.

The ramp down control circuit 416 smoothly control the ramping down of the pulsed high voltage signal 213 to avoid overshoot and also to prevent high current flowing condition in the high voltage devices due to fast ramp down. The ramp down control circuit 416 also avoids the abnormal out of range high voltage condition occurring in the high voltage devices due to uncontrolled response due to fast ramp down.

The drain-source terminals of the PH PMOS transistor 1527, the NX NMOS transistor 1506, and the NH NMOS transistor 1513 are coupled in series between the pulsed high voltage signal 213 and ground to control the ramping of the pulsed high voltage (VSPD) 213 by shunting current through the transistors 1527, 1506, and 1513. The gates of the transistors 1506 and 1527 are coupled to the supply voltage (VSUP) 220. The PH PMOS transistor 1527 keeps the discharge voltage of the pulsed high voltage 213 at an intermediate voltage (e.g., VDD+VTPH). The NX NMOS transistor 1506 buffers the high voltage on the NH NMOS transistor 1513.

The transistors 1510, 1511, 1525, and 1526 provide a bias current to the NH NMOS transistor 1513. The drain-source terminals of the P PMOS transistor 1525 and the NH NMOS transistor 1511 are coupled in series between the common node formed of the gate of the NX NMOS transistor 1506 and the supply voltage (VSUP) 220 and ground. The drain-source terminals of the P PMOS transistor 1526 are coupled between the supply voltage (VSUP) 220 and the gate of the NH NMOS transistor 1513. The first bias current (IBNSPRMD) 464-1 is applied to the gate of the NH NMOS transistor 1511. The drain-source terminals of the P PMOS transistor 1526 and the NH NMOS transistor 1512 are coupled in series between the supply voltage (VSUP) 220 and ground. The drain of the P PMOS transistor 1526 is coupled to the gate of the NH NMOS transistor 1513. The drain-source terminals of the NH NMOS transistor 1510 is coupled between the gate of the NH NMOS transistor 1511 and ground. The gate and the drain of the NH NMOS transistor 1510 are coupled to each other. The capacitors 1515 and 1517 are coupled in series between the pulsed high voltage 213 and the gate of the NH NMOS transistor 1513. The drain-source terminals of the NH NMOS transistor 1508 is coupled between a common node formed by the gate of the NX NMOS transistor 1506 and the power supply (VSUP) 220 and a common node formed by the coupling between the capacitors 1515 and 1517.

The capacitors 1515 and 1517 and the bias current from the transistors 1510, 1511, 1525, and 1526 control the shunting of transistors 1527, 1506, and 1513 and the ramping down of the pulsed high voltage 213. The NH NMOS transistor 1508 holds the voltage on the capacitor 1517 at VDD-VTNH to protect the gate of capacitor 1517 from discharge to ground. The NH NMOS transistor 1508 also keeps the gate from having a voltage less than ground when the pulsed high voltage 213 is discharged to ground through capacitive coupling from the capacitor 1515. This could forward bias the n+/p source drain junction that could inject carriers into the substrate, resulting in uncontrollable coupling noise.

The NAND gate 1502, the inverter 1503, the power down signal generator 1504, the NH NMOS transistors 1509 and 1512, and the P PMOS transistor 1524 power down the ramp down control circuit (vsprmpd) 416 to a zero standby current. The power down signal generator 1504 generates an inverted power down (PDBI) signal 1520 in response to the power down (PD) signal 228. The NAND gate 1502 generates a power down enable signal 1522 in response to the inverted power down (PDBI) signal 1520 and the enable ramp down (ENRMPD) signal 481. The inverter 1503 generates an inverted power down enable signal 1523 in response to the power down enable signal 1522. The drain-source terminals of the NH NMOS transistor 1512 couple the gate of the NH NMOS transistor 1513 to ground in response to the power down enable signal 1522 applied to the gate of the NH NMOS transistor 1512 to disable the NH NMOS transistor 1513 during power down. The drain-source terminals of the NH NMOS transistor 1509 couple the gate of the NH NMOS transistor 1511 to ground in response to the power down enable signal 1522 applied to the gate of the NH NMOS transistor 1509 to disable the NH NMOS transistor 1511 during power down. The drain-source terminals of the P PMOS transistor 1524 couple the gate, source and drain of the P PMOS transistor 1525 to each other and couple the gate and source of the PMOS transistor 1526 to each other.

A high voltage power down (PDHV) signal 484 powers down the operational amplifier 404 and biases the NH NMOS transistor 449 to couple the pulsed high voltage signal (VSPS) 477 to ground.

The high voltage power down (PDHV) signal 484 also disables the high voltage level shifter 408 through the logic circuit formed of the gates 456, 460, and 458. The NX NMOS transistor 428 couples the high voltage signal (VSPLEV0) 467 to the step input voltage 472 applied to the operational amplifier 404. The high voltage level shifter 408 provides an enable signal (ENMIDSPHVB) signal 485 to control the NX NMOS transistor 428, and controls the high voltage level shifter 409 through the NX NMOS transistor 429 and the AND gate 452. The high voltage level shifter 408 is controlled by the logic gates 456, 458, 459, and 460 in conjunction with the OR gate 457. The NX NMOS transistors 429 and 430 are used to buffer the high voltage to low voltage before applying to OR gate 456 and AND gate 452 to achieve a timing relationship of enabling and disabling the NX NMOS transistor 428, e.g., the transistor 436 is turned off before the transistor 428 is turned on and the transistor 428 is turned off before the transistor 436 is turned on. This is to avoid the high voltage signal (VSPLEV0) 467 from discharging to the supply voltage (VSUP) 220 by the transistors 428 and 436. This leads to long recovery time for the high voltage signal (VSPLEV0).

The NH NMOS transistor 436 couples the step input voltage 472 to the supply voltage 220 in response to the output of the high voltage level shifter 409.

The high voltage level shifter 409 also controls circuits for controlling the output (VSP) 473, the input (VSPN) 486 and a voltage (VSFI). In one embodiment here, the voltage VSFI is the internal source follower voltage of the op amp, driving the op amp output buffer stage. Since the output buffer stage of the op amp is very low impedance, it is advantageous to do signal processing on the input to the output buffer stage to optimize, for example, speed (e.g., quickly driving VSFI from external circuit because internal driving from the op amp is power limited) and power (e.g., no short circuit condition on the output buffer stage due to different condition from input and output of the output buffer stage). The diode-connected NX NMOS transistor 431, the NH NMOS transistors 440 and 437 are arranged in a cascode arrangement between the voltage (VSFI) and the supply voltage 220. The diode connected NX NMOS transistor 432, and the NH NMOS 439, 438 are arranged in a cascode arrangement between the output voltage (VSP) 473 and the supply voltage 220. The diode connected NX NMOS transistor 433 is coupled between the voltage (VSPN) 486 and the source of the NX NMOS transistor 432. The NH NMOS transistors 439 and 440 are biased by the low voltage high supply signal (VSUPHVLS) 212. The NH NMOS transistors 437 and 438 are controlled by the high voltage level shifter 409. The NMOS transistors 431, 440, 437, 432, 439, and 438 are used to pull the voltage VSFI and the output (VSP) 473 to be middle voltage level plus a threshold voltage of NX NMOS transistor (VTX). The NMOS transistors 433 and 439 pull down the voltage (VSPN) 486 to a middle voltage level plus the threshold voltage VTX.

A ping pong scheme is used to optimize the speed of the high voltage pulser. The timing relationship between the high voltage level (VSPLEV0) 467 and the pulsed high voltage (VSPD) signal 213 is such that the high voltage level (VSPLEV0) 467 is enabled (set up) for the next value (incremental or flat) while the pulsed high voltage (VSPD) 213 is at the low level (340 in FIG. 3B). The voltage level of the high voltage level (VSPLEV0) 467 does not return to a low level (e.g., ground) from a high voltage level, leading to faster settling time and efficient utilization of high voltage power. The timing is also non-overlapping such that the level on high voltage level (VSPLEV0) is not intentionally discharged to a low level.

In another embodiment, a parallel ping-pong scheme includes two high voltage pulsers (high voltage pulsing circuit 400) that alternately deliver the high voltage pulse trains. While one high voltage pulser delivers one high voltage pulse train, the other high voltage pulser is set up with the high voltage level. This effectively doubles the speed of the high voltage pulser. In yet another embodiment, the system includes two high voltage drivers (operational amplifier 404) that alternately deliver the high voltage pulse trains from using only one high voltage level generator 403.

Figure 16:
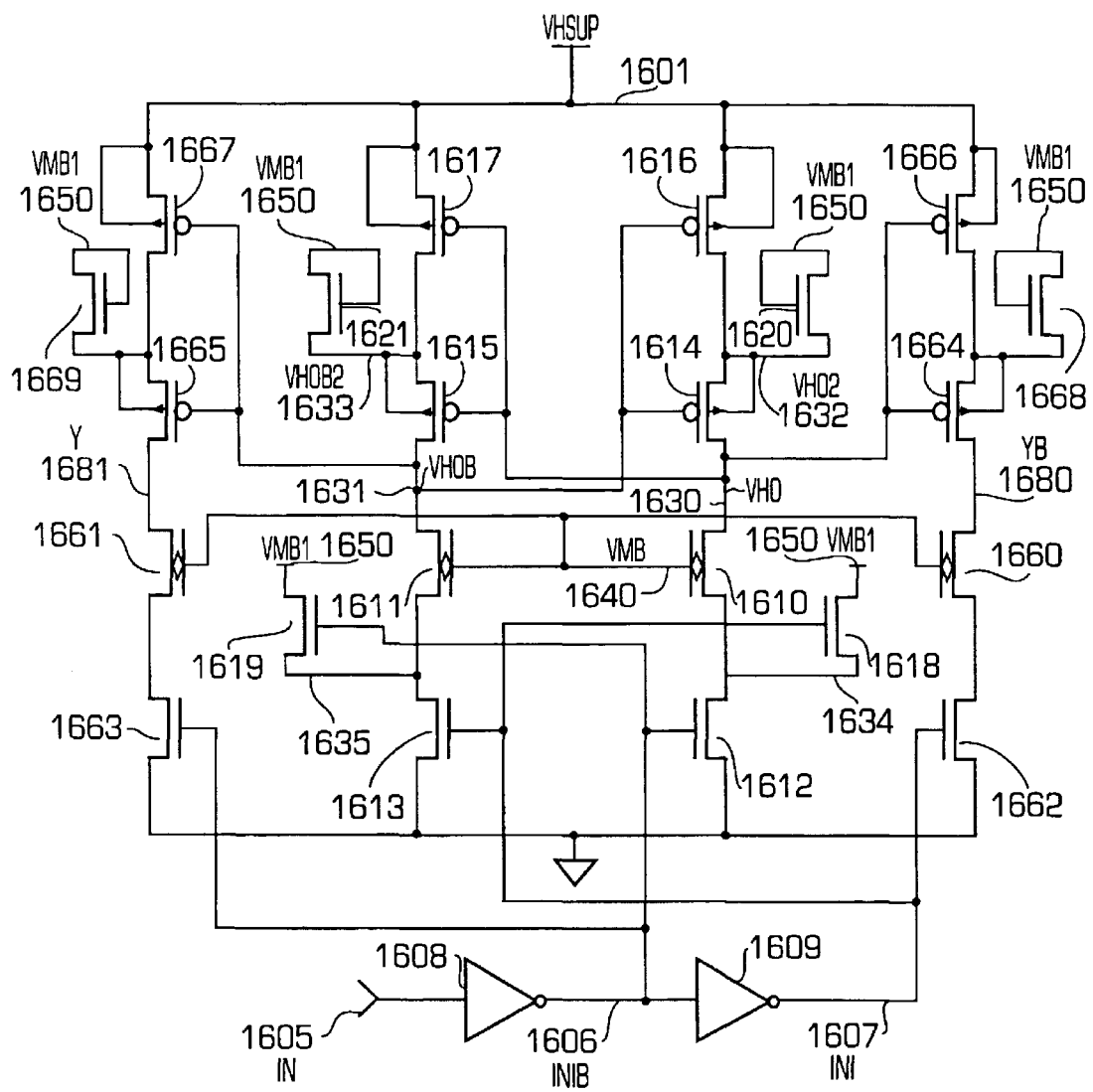
FIG. 16 is a block diagram of the high voltage level shifter of the high voltage pulsing circuit of FIG. 4.

FIG. 16 is a block diagram of the high voltage level shifter high voltage level shifters 405, 406, 407, 408, 409, 410, 411, 412, and 413.

The high voltage level shifter comprises a plurality of inverters 1608, 1609, a plurality of NMOS transistors 1610–1613, 1618–1621, 1660–1663, 1668–1669, and a plurality of PMOS transistors 1614–1617, 1664–1667. The transistors 1610–1621 form a cross coupled stage. The transistors 1660–1669 form an output buffer stage. The series connected inverters 1608–1609 provide the input control signals. The NMOS transistors 1610, 1611, 1660, 1661 are NX NMOS high voltage transistors. The PMOS transistors 1614–1617, 1664–1667 are PH PMOS transistors. The NMOS transistors 1620–1621, 1668–1669 are NH NMOS transistors. The NMOS transistors 1612,1613,1618, 1619,1662,1663 are HV NMOS transistors. Alternatively, the NMOS transistors 1612,1613,1618,1619,1662,1663 are low voltage (LV) NMOS transistors due to the high voltage being buffered by the transistors 1610, 1611, 1160, and 1161.

A high voltage supply (VHSUP) 1601 has a voltage value typically higher than the power supply voltage. A VMB node 1640 receives a medium bias voltage, e.g. VCC. A VMB1 node 1650 receives another medium bias voltage, e.g. VCC.

In the cross coupled stage, the PMOS pull up is divided into two series PMOS 1614 and 1616 to reduce high voltage stress. The drain-source terminals of the PMOS transistors 1614 and 1616 are coupled together in series between the high voltage (VHSUP) 1601 and a high voltage output (VHO) node 1630. The gates of the PMOS transistors 1614 and 1616 are coupled together and to a complementary high voltage output (VHOB) node 1631. The PMOS transistor 1614 has its well connected to a common node formed of the drain of the PMOS transistor 1616, a second high voltage (VHO2) node 1632 and the source of the diode connected NMOS transistor 1620, which has its drain coupled to the VMB1 node 1650. The PMOS transistors 1615 and 1617, and the NMOS transistor 1621 are similarly coupled together, replacing the VHO2 node 1632 with a VHOB2 node 1633, and the VHOB node 1631 being interchanged with the VHO node 1630. Each PMOS transistor 1614, 1615, 1664, 1665 has its own well. The drain-source terminals of the NMOS transistors 1610, 1612 are coupled together in series between the VHO node 1630 and ground. The drain-source terminals of the NMOS transistors 1611, 1613 are coupled between the VHOB node 1631 and ground. The gates of the NMOS transistors 1610 and 1611 are coupled together and to the VMB node 1640. The drain-source terminals of the NMOS transistors 1618 and 1619 are coupled between the sources of the respective NMOS transistors 1610 and 1611, which form respective nodes 1634 and 1635, and the VMB1 node 1650. The gates of the NMOS transistors 1618 and 1613 are coupled to the output of the inverter 1609 to receive a INI signal 1607. The gates of the NMOS transistor 1612 and 1619 are coupled together and to the output of the inverter 1608 to receive an INIB signal 1606, which is an inversion of a IN signal 1605 applied to the inverter 1608. As the gates of the PMOS transistors 1614 and 1616 transitions from low to high, the voltage at the VHO2 node 1632 goes from the high voltage VHSUP 1601 to a low minimum voltage (VMB1−VTNH), hence the junction break down of the PMOS transistors 1614, 1616 has been improved by at least (VMB1−VTNH).

In the cross coupled stage, the transistors 1618–1619 provide a fast early pull up at the nodes 1634–1635, and hence the nodes 1630–1631 reduce the crow bar current when switching by reducing quickly the VGS (gate-source voltage) of the PMOS transistors 1615, 1617 and 1614, 1616. The position of the NMOS transistors 1618, 1619 is strategically placed at the nodes 1634, 1635 to eliminate the break down of the circuits. In another embodiment, the control signals applied to the gates of the transistors 1612, 1613, 1618, 1619, 1662, 1663 are appropriately non-overlapped or overlapped to avoid further the crow bar switching current.

Alternatively the early pull up (at the source of the transistors 1660, 1661) may be implemented at the output stage to decrease the pull up time.

In the output stage, the PMOS transistors 1666 and 1664 and the NMOS transistors 1660, 1662, and 1668 are coupled together in a manner similar to the PMOS transistors 1617, 1615 and the NMOS transistors 1611, 1613, and 1621, but with replacing the VHOB node 1631 with an output YB node 1680. Likewise, the PMOS transistors 1667 and 1665 and the NMOS transistors 1661, 1663, and 1669 are coupled together in a manner similar to the PMOS transistors 1616, 1614 and the NMOS transistors 1610, 1612, and 1620, but with replacing the VHO node 1630 with an output Y node 1681. The NMOS transistors 1668 and 1669 on the output buffer stage functions similar to the NMOS transistors 1620, 1621.

The high voltage level shifter functions as follows. For a high value of the IN signal 1605, a the INIB signal 1606 is low, and the INI signal 1607 is high. A low value of the INIB signal 1606 turns off the NMOS transistors 1612, 1619 and 1663. A high value of the INI 1607 signal turns on the NMOS transistor 1613, 1618 and 1662. The NMOS transistor 1613 being on causes the nodes 1635, 1631 to be low. The NMOS transistor 1662 being on causes the node 1680 to be low. The node 1631 being low turns on PMOS transistors 1665, 1667 that pulls up the node Y 1681 to the high voltage VHSUP 1601. For a low value of the IN signal 1605, the described on and off states of the high voltage level shifter are reversed. The nodes 1680 and 1681 provide the drive signals for controlling the transfer gates 418 through 423 and the transistors 428, 436, 437, 438, 446 and 448 (see FIG. 4).

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. A system for generating a pulsed high voltage signal, the system comprising:
   a reference current generator,
   a first voltage to current converter coupled to the reference current generator for generating a first current,
   a second voltage to current converter coupled to the reference current generator for generating a second current, the second current being adjustable, a summing circuit coupled to the first and second voltage to current converters to generate a summed current in response to the first and second currents; and a current to voltage converter coupled to the summing circuit to generate a first high voltage signal in response to the summed current, the high voltage signal having a voltage greater than an applied supply voltage.

2. A system for generating a pulsed high voltage signal, the system comprising:

a reference current generator, a first voltage to current converter coupled to the reference current generator for generating a first current, a second voltage to current converter coupled to the reference current generator for generating a second current, the second current being adjustable, a summing circuit coupled to the first and second voltage to current converters to generate a summed current in response to the first and second currents;

a current to voltage converter coupled to the summing circuit to generate a first high voltage signal in response to the summed current; and an operational amplifier coupled to the current to voltage converter to generate a second high voltage signal in response to the first high voltage signal.

3. The system of claim 1 wherein the reference current generator, the first voltage to current converter, the second voltage to current converter, and the summing circuit operate at a low voltage and the current to voltage converter operates at high voltage.

4. A system for generating a pulsed signal, the system comprising:

a bias current generator for generating a plurality of bias currents;

a high voltage level generator generating a first high voltage signal in response to at least one of the bias currents; and an operational amplifier having a first input coupled to the high voltage level generator, having an output for generating a pulsed shaped high voltage signal, and having a second input for receiving the pulsed shaped high voltage signal.

5. The system of claim 4 wherein the operational amplifier is operated in a closed loop configuration.

6. The system of claim 5 wherein the operational amplifier is operated in a nested closed loop configuration.

7. The system of claim 6 wherein the nested closed loop configuration is an overlapped driven closed loop.

8. The system of claim 4 wherein the operational amplifier is operated in a nested closed loop configuration with a local closed loop and a global closed loop, the system further comprising a ramp down control circuit for controlling the ramp down of the output voltage of the operational amplifier, the local loop being enabled before the ramp down circuit is enabled.

9. The system of claim 8 wherein the operational amplifier is enabled to provide the pulsed shaped high voltage signal having a middle voltage level after the ramp down is enabled.

10. The system of claim 8 further comprising a ramp up control circuit coupled to the first input of the operational amplifier to control the ramp up speed of the first high voltage signal.

11. The system of claim 8, wherein the high voltage level generator comprises a reference voltage generator for generating first and second reference voltages, an incremental current generator for generating an incremental current in response to the first reference voltage, an initial current generator for generating an initial current in response to the second reference voltage, and a high voltage current to voltage converter for generating the first high voltage signal in response to the incremental current and the initial current.

12. The system of claim 11 wherein the incremental current is selectable.

13. The system of claim 11 wherein the incremental current is selectable in a range.

14. The system of claim 11, wherein the reference voltage generator comprises:

an operational amplifier generating an output signal in response to the first reference voltage and a feedback signal;

a PMOS transistor including a drain coupled to a supply voltage terminal, a source, and a gate;

an NMOS transistor including a gate coupled to the output of the operational amplifier, a drain coupled to the source of the PMOS transistor, and a source providing the feedback signal; and a resistor divider coupled between the source of the NMOS transistor and a ground terminal.

15. The system of claim 14, wherein the resistor divider provides the first and second reference voltages.

16. The system of claim 11, wherein the initial current generator comprises:

an operational amplifier generating an output signal in response to the first reference voltage and a feedback signal;

a PMOS transistor including a drain coupled to a supply voltage terminal, a source, and a gate;

an NMOS transistor including a gate coupled to the output of the operational amplifier, a drain coupled to the source of the PMOS transistor, and a source providing the feedback signal and the initial current; and a resistor divider coupled between the source of the NMOS transistor and a ground terminal.

17. The system of claim 11, wherein the reference voltage generator comprises:

a first operational amplifier generating an output signal in response to a first reference voltage and a first feedback signal;

a first PMOS transistor including a drain coupled to a supply voltage terminal, a source and a gate;

a first NMOS transistor including a gate coupled to the output of the first operational amplifier, a drain coupled to the source of the first PMOS transistor, and a source providing the first feedback signal; and a resistor divider coupled between the source of the first NMOS transistor and a ground terminal, and wherein the initial current generator comprises:

a second operational amplifier generating an output signal in response to a second reference voltage and a second feedback signal;

a second PMOS transistor including a drain coupled to the supply voltage terminal, a source and a gate;

a second NMOS transistor including a gate coupled to the output of the second operational amplifier, a drain coupled to the source of the second PMOS transistor, and a source providing the second feedback signal and the initial current; and a resistor coupled between the source of the second NMOS transistor and the ground terminal.

18. The system of claim 17 wherein the resistor divider and the resistor match.

19. The system of claim 11 wherein the current to voltage converter comprising:
a first transistor of a first type including a first terminal, including a second terminal for receiving a summed current of the incremental current and the initial current, including a channel between the first and second terminals, and including a gate for controlling current in said channel in response to a power down signal;
a first plurality of transistors of a second type, each of the first plurality of transistors of a second type including a first terminal, including a second terminal, including a channel between the first and second terminals, and including a gate coupled to said second terminal and for controlling current in said channel, the first plurality of transistors of the second type being coupled in series between a high voltage terminal and the first terminal of the first transistor of the first type;
an output terminal for providing the first high voltage signal;
a resistor coupled between the output terminal and a ground terminal;
a second transistor of a first type including a first terminal, including a second terminal coupled to the output terminal, including a channel between the first and second terminals, and including a gate for controlling current in said channel in response to a power down signal; and
a second plurality of transistors of a second type, each of the first plurality of transistors of a second type including a first terminal, including a second terminal, including a channel between the first and second terminals, and including a gate coupled to said second terminal and for controlling current in said channel, the second plurality of transistors of the second type being coupled in series between a high voltage terminal and the first terminal of the second transistor of the first type, the gates of the second plurality of transistors of the second type being coupled to a second terminal of a corresponding one of the first plurality of transistors of the first type.

20. The system of claim 5, further comprising a ramp up control circuit coupled to the first input of the operational amplifier to control the ramp up speed of the first high voltage signal.

21. The system of claim 20 wherein the ramp up control circuit comprises
a first transistor of a first type including a first terminal coupled to the first input of the operational amplifier, including a second terminal, including a channel between the first and second terminals, and including a gate for controlling current in said channel in response to a power signal;
a second transistor of a first type including a first terminal coupled to the second terminal of the first transistor of the first type, including a second terminal coupled to a ground terminal, including a channel between the first and second terminals, and including a gate for controlling current in said channel;
a third transistor of a first type including a first terminal coupled to the gate of the second transistor of the first type, including a second terminal coupled to the ground terminal, including a channel between the first and second terminals, and including a gate for controlling current in said channel in response to a first bias signal;
a fourth transistor of a first type including a first terminal coupled to the gate of the third transistor of the first type, including a second terminal coupled to the ground terminal, including a channel between the first and second terminals, and including a gate for controlling current and coupled to said first terminal;
a first capacitor including a first terminal coupled to the first terminal of the first transistor of the first type and including a second terminal;
a second capacitor including a first terminal coupled to the second terminal of the first capacitor and including a second terminal coupled to the gate of the second transistor of the first type; and
a fifth transistor of a first type including a first terminal for receiving the summed current and coupled to the first terminal of the fourth transistor of the first type, including a second terminal and coupled to the ground terminal, including a channel between the first and second terminals, and including a gate for controlling current in said channel in response to a power down signal.

22. The system of claim 5 further comprising a ramp down control circuit for controlling the ramp down of the output voltage of the operational amplifier.

23. The system of claim 22 wherein the ramp down control circuit comprises
a first transistor of a first type including a first terminal, including a second terminal, including a channel between the first and second terminals, and including a gate for controlling current in said channel in response to a power signal;
a first transistor of a second type including a first terminal coupled to the output of the operational amplifier, including a second terminal coupled to the first terminal of the first transistor of the first type, including a channel between the first and second terminals, and including a gate for controlling current in said channel in response to the power signal
a second transistor of a first type including a first terminal coupled to the second terminal of the first transistor of the first type, including a second terminal coupled to a ground terminal, including a channel between the first and second terminals, and including a gate for controlling current in said channel;
a third transistor of a first type including a first terminal, including a second terminal coupled to the ground terminal, including a channel between the first and second terminals, and including a gate for controlling current in said channel in response to a first bias signal;
a fourth transistor of a first type including a first terminal coupled to the gate of the third transistor of the first type, including a second terminal coupled to the ground terminal, including a channel between the first and second terminals, and including a gate for controlling current and coupled to said first terminal;
a first capacitor including a first terminal coupled to the first terminal of the first transistor of the second type and including a second terminal;
a second capacitor including a first terminal coupled to the second terminal of the first capacitor and including a second terminal coupled to the gate of the second transistor of the first type; and
a fifth transistor of a first type including a first terminal coupled to the gate of the first transistor of the first type, including a second terminal coupled to the second terminal of the first capacitor, including a channel between the first and second terminals, and including a gate for controlling current in said channel and coupled to said first terminal;

a second transistor of the second type including a first terminal coupled to the power signal, including a second terminal coupled to the gate of the second transistor of the first type, including a channel between the first and second terminals, and including a gate for controlling current in said channel; and a third transistor of the second type including a first terminal coupled to the power signal, including a second terminal coupled to a common node formed of the gate of the second transistor of the second type and the first terminal of the third transistor of the first type, including a channel between the first and second terminals, and including a gate for controlling current in said channel and coupled to said first terminal.

24. The system of claim 4, further comprising a control circuit coupled to the output of the operational amplifier to output the pulsed shaped high voltage signal, wherein the high voltage level generator sets the first high voltage signal at a next level when the pulsed shaped high voltage signal is at a low level, and the voltage level of the first high voltage signal is not returned to a zero level after being at a high level.

25. The system of claim 4, further comprising:
a second bias current generator for generating a second plurality of bias currents;
a second high voltage level generator generating a second high voltage signal in response to at least one of the second bias currents; and
a second operational amplifier having a first input coupled to the second high voltage level generator, having an output for generating a second pulsed shaped high voltage signal, and having a second input for receiving the second pulsed shaped high voltage signal, the pulsed shaped high voltage signals being alternately outputted.

26. The system of claim 4 further comprising a second operational amplifier having a first input coupled to the high voltage level generator, having an output for generating a second pulsed shaped high voltage signal, and having a second input for receiving the second pulsed shaped high voltage signal, the operational amplifiers alternately outputting the pulsed shaped high voltage signals.

27. A memory system comprising:
a plurality of memory cells, each memory cell being configurable to store one of a plurality of signal levels being stored in accordance with programming signals; and
a supply source for generating said programming signals in response to a pulsed shaped high voltage signal, the supply source including:
a bias current generator for generating a plurality of bias currents;
a high voltage level generator generating a first high voltage signal in response to at least one of the bias currents; and
an operational amplifier having a first input coupled to the high voltage level generator, having an output for generating the pulsed shaped high voltage signal, and having a second input for receiving the pulsed shaped high voltage signal.

28. The system of claim 27 wherein the memory cells comprise source side injection flash memory cells.

29. The system of claim 28 wherein the supply source includes a voltage mode sensing circuit for programming said memory cells.

30. The system of claim 28 wherein the supply source comprises a current mode sensing circuit for programming said memory cells.

31. The system of claim 28 wherein the flash memory cell includes a control gate, a source and a drain, wherein the supply source provides a pulse train to the source of the memory cells for programming, the pulse train including a plurality of pulses having a low voltage level, a middle voltage level, and a high voltage level, the supply source supplying a bias voltage on said control gate during the low and middle voltage levels and disabling said bias voltage during a trailing middle voltage level on a falling edge of the high voltage level or a next low voltage level, a bias current being applied to the drain of the memory cell during a low voltage level and the middle level and being disabled during the trailing middle voltage level or a next low voltage level.

32. A ramp down control circuit comprising:
a first transistor of a first type including a first terminal, including a second terminal, including a channel between the first and second terminals, and including a gate for controlling current in said channel in response to a power signal;
a first transistor of a second type including a first terminal for coupling to an output of an operational amplifier, including a second terminal coupled to the first terminal of the first transistor of the first type, including a channel between the first and second terminals, and including a gate for controlling current in said channel in response to the power signal
a second transistor of a first type including a first terminal coupled to second terminal of the first transistor of the first type, including a second terminal coupled to a ground terminal, including a channel between the first and second terminals, and including a gate for controlling current in said channel;
a third transistor of a first type including a first terminal, including a second terminal coupled to the ground terminal, including a channel between the first and second terminals, and including a gate for controlling current in said channel in response to a first bias signal;
a fourth transistor of a first type including a first terminal coupled to the gate of the third transistor of the first type, including a second terminal coupled to the ground terminal, including a channel between the first and second terminals, and including a gate for controlling current and coupled to said first terminal;
a first capacitor including a first terminal coupled to the first terminal of the first transistor of the second type and including a second terminal;
a second capacitor including a first terminal coupled to the second terminal of the first capacitor and including a second terminal coupled to the gate of the second transistor of the first type;
a fifth transistor of a first type including a first terminal coupled to the gate of the first transistor of the first type, including a second terminal coupled to the second terminal of the first capacitor, including a channel between the first and second terminals, and including a gate for controlling current in said channel and coupled to said first terminal;
a second transistor of the second type including a first terminal coupled to the power signal, including a second terminal coupled to the gate of the second transistor of the first type, including a channel between the first and second terminals, and including a gate for controlling current in said channel; and a third transistor of the second type including a first terminal coupled to the power signal, including a second terminal coupled to a common node formed of the gate of the second transistor of the second type and the first terminal of the third transistor of the first type, including a channel between the first and second terminals, and including a gate for controlling current in said channel and coupled to said first terminal.

33. The ramp down control circuit of claim 32 further comprising:
an operational amplifier having a first input for receiving a high voltage control signal, having a second input, and having an output for generating a pulsed shaped high voltage signal and coupled to said second input and to the second terminal of the first transistor of the second type.

34. A ramp up control circuit comprising:
a first transistor of a first type including a first terminal for coupling to a first input of an operational amplifier, including a second terminal, including a channel between the first and second terminals, and including a gate for controlling current in said channel in response to a power signal;
a second transistor of a first type including a first terminal coupled to the second terminal of the first transistor of the first type, including a second terminal coupled to a ground terminal, including a channel between the first and second terminals, and including a gate for controlling current in said channel;
a third transistor of a first type including a first terminal coupled to the gate of the second transistor of the first type, including a second terminal coupled to the ground terminal, including a channel between the first and second terminals, and including a gate for controlling current in said channel in response to a first bias signal;
a fourth transistor of a first type including a first terminal coupled to the gate of the third transistor of the first type, including a second terminal coupled to the ground terminal, including a channel between the first and second terminals, and including a gate for controlling current and coupled to said first terminal;
a first capacitor including a first terminal coupled to the first terminal of the first transistor of the first type and including a second terminal;
a second capacitor including a first terminal coupled to the second terminal of the first capacitor and including a second terminal coupled to the gate of the second transistor of the first type; and
a fifth transistor of a first type including a first terminal for receiving the first bias signal, including a second terminal coupled to the ground terminal, including a channel between the first and second terminals, and including a gate for controlling current in said channel in response to a power down signal.

35. The ramp up control circuit of claim 34 further comprising:
an operational amplifier having a first input for receiving a high voltage control signal and coupled to the first terminal of the first transistor of the first type, having a second input, and having an output for generating a pulsed shaped high voltage signal and coupled to said second input.

36. A high voltage generator comprising:
a charge pump for generating a high voltage pump signal in response to a supply voltage and timing control signals; and a plurality of supply regulators, each supply regulator generating an output high voltage signal, each high voltage supply regulator comprising a first circuit for buffering an applied high voltage signal and including a push pull source follower for regulation, an operational amplifier for controlling said voltage regulation, a bias circuit for controlling an input voltage in response to said applied high voltage signal,
wherein the applied high voltage signal applied to one of said high voltage regulators being the high voltage pump signal and the applied high voltage signal applied to others of said high voltage regulators being one of the output high voltage signals.

37. The system of claim 36 wherein at least one of the buffer circuits comprises:
a first transistor of a first type including a first terminal coupled to an applied high voltage signal terminal, including a second terminal spaced apart from said first terminal with a channel therebetween, and including a gate for controlling current in said channel and coupled to the output of the operational amplifier;
a first transistor of a second type including a first terminal coupled to the second terminal of the first transistor of the first type, including a second terminal spaced apart from said first terminal with a channel therebetween, and including a gate for controlling said current in said channel and coupled to the second terminal of the first transistor of the second type;
a second transistor of the first type including a first terminal coupled to the second terminal of the first transistor of the second type, including a second terminal spaced apart from said first terminal with a channel therebetween, and including a gate for controlling current in said channel in response to a supply voltage;
a third transistor of the first type including a first terminal coupled to the second terminal of the second transistor of the first type, including a second terminal spaced apart from said first terminal with a channel therebetween and coupled to a ground terminal, and including a gate for controlling current in said channel in response to a bias voltage;
a fourth transistor of the first type including a first terminal coupled to the applied high voltage signal terminal, including a second terminal spaced apart from said first terminal with a channel therebetween and providing said output high voltage signal, and including a gate for controlling current in said channel and coupled to the second terminal of the first transistor of the first type;
a second transistor of the second type including a first terminal coupled to the second terminal of the fourth transistor of the first type, including a second terminal spaced apart from said first terminal with a channel therebetween, and including a gate for controlling current in said channel and coupled to the second terminal of the first transistor of the second type;
a third transistor of the second type including a first terminal coupled to the second terminal of the second transistor of the second type, including a second terminal spaced apart from said first terminal with a channel therebetween, and including a gate for controlling current in said channel in response to said supply voltage;
a fifth transistor of the first type including a first terminal coupled to the second terminal of the third transistor of the second type, including a second terminal spaced apart from said first terminal with a channel therebetween and coupled to a ground terminal, and including a gate for controlling current in said channel in response to said supply voltage.

38. A method for generating a high voltage signal, the method comprising:

generating a high voltage level signal;

generating a pulsed high voltage signal, wherein the high voltage level signal is set at a next level when the pulsed high voltage signal is at a low level, the voltage level of the high voltage level signal not being a zero level after being a high level.

* * * * *